United States Patent
Goden et al.

(10) Patent No.: US 10,652,496 B2
(45) Date of Patent: May 12, 2020

(54) PHOTOELECTRIC CONVERSION DEVICE, PHOTOELECTRIC CONVERSION SYSTEM, AND MOVABLE BODY

(71) Applicant: CANON KABUSHIKI KAISHA, Tokyo (JP)

(72) Inventors: Tatsuhito Goden, Machida (JP); Yukihiro Kuroda, Inagi (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 16/254,779

(22) Filed: Jan. 23, 2019

(65) Prior Publication Data
US 2019/0238780 A1 Aug. 1, 2019

(30) Foreign Application Priority Data

Jan. 29, 2018 (JP) .................. 2018-012589

(51) Int. Cl.
H04N 5/374 (2011.01)
H04N 5/3745 (2011.01)
H04N 5/369 (2011.01)
H04N 5/378 (2011.01)
H01L 27/146 (2006.01)

(52) U.S. Cl.
CPC ... H04N 5/37457 (2013.01); H01L 27/14621 (2013.01); H01L 27/14627 (2013.01); H01L 27/14645 (2013.01); H01L 27/14665 (2013.01); H04N 5/3696 (2013.01); H04N 5/36961 (2018.08); H04N 5/374 (2013.01); H04N 5/378 (2013.01); H01L 27/14603 (2013.01)

(58) Field of Classification Search
CPC .. H04N 5/37457; H04N 5/374; H04N 5/3696; H04N 5/378; H04N 5/36961; H01L 27/14665; H01L 27/14645; H01L 27/14621; H01L 27/14627; H01L 27/14603
See application file for complete search history.

(56) References Cited

U.S. PATENT DOCUMENTS 7,709,869 B2  5/2010  Kuroda
7,911,521 B2  3/2011  Kuroda et al.
(Continued)

FOREIGN PATENT DOCUMENTS

JP   2013-258168 A   12/2013
JP   2015-207594 A   11/2015
JP   2017-092150 A   5/2017

Primary Examiner — Mekonnen D Dagnew
(74) Attorney, Agent, or Firm — Venable LLP

(57) ABSTRACT

A photoelectric conversion device in which pixels are arranged in a matrix, wherein each of the pixels includes: at least one pixel electrode, a photoelectric conversion layer, a counter electrode, and a pixel circuit that is connected to the pixel electrode and outputs a signal from the pixel electrode, wherein a pixel circuit group corresponding to a pixel group formed of the pixels positioned adjacent to each other is disposed below a pixel electrode group of the pixel group, wherein the pixel group includes a first pixel, and a second pixel having more independent pixel electrodes than the first pixel, wherein each of the pixel circuits is connected to each of the independent pixel electrodes, and wherein the first pixel overlaps with the pixel circuit that corresponds to the first pixel, and with the pixel circuit that does not correspond to the first pixel in a plan view.

17 Claims, 19 Drawing Sheets

(56) References Cited

U.S. PATENT DOCUMENTS

| | | |
|---|---|---|
| 7,935,995 B2 | 5/2011 | Watanabe et al. |
| 8,223,238 B2 | 7/2012 | Kuroda et al. |
| 8,345,137 B2 | 1/2013 | Shinohara et al. |
| 8,710,558 B2 | 4/2014 | Inoue et al. |
| 9,236,406 B2 | 1/2016 | Kuroda |
| 9,445,023 B2 | 9/2016 | Kuroda et al. |
| 9,774,810 B2 | 9/2017 | Tashiro et al. |
| 9,991,305 B2 | 6/2018 | Goden et al. |
| 10,021,316 B2 | 7/2018 | Kuroda |
| 2014/0160103 A1* | 6/2014 | Lu .................. G09G 3/3696 345/212 |
| 2017/0212221 A1 | 7/2017 | Goden et al. |
| 2018/0096663 A1* | 4/2018 | Xu ..................... G09G 3/36 |
| 2018/0309947 A1* | 10/2018 | Hatano ............ H01L 27/14632 |
| 2018/0316884 A1 | 11/2018 | Kuroda et al. |

\* cited by examiner

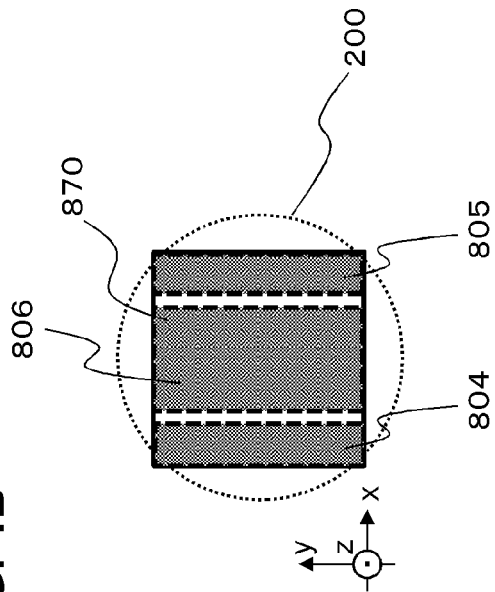
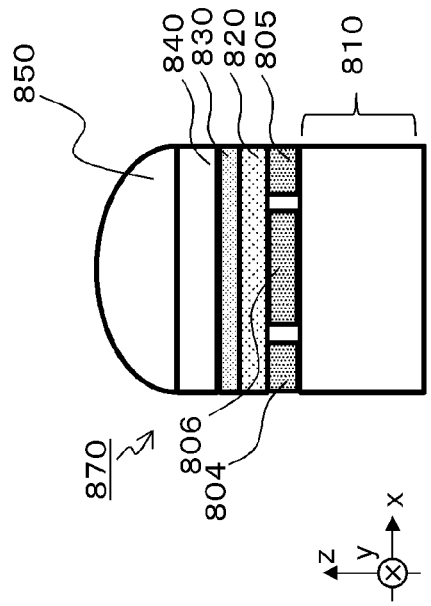
FIG. 4A
FIG. 4B

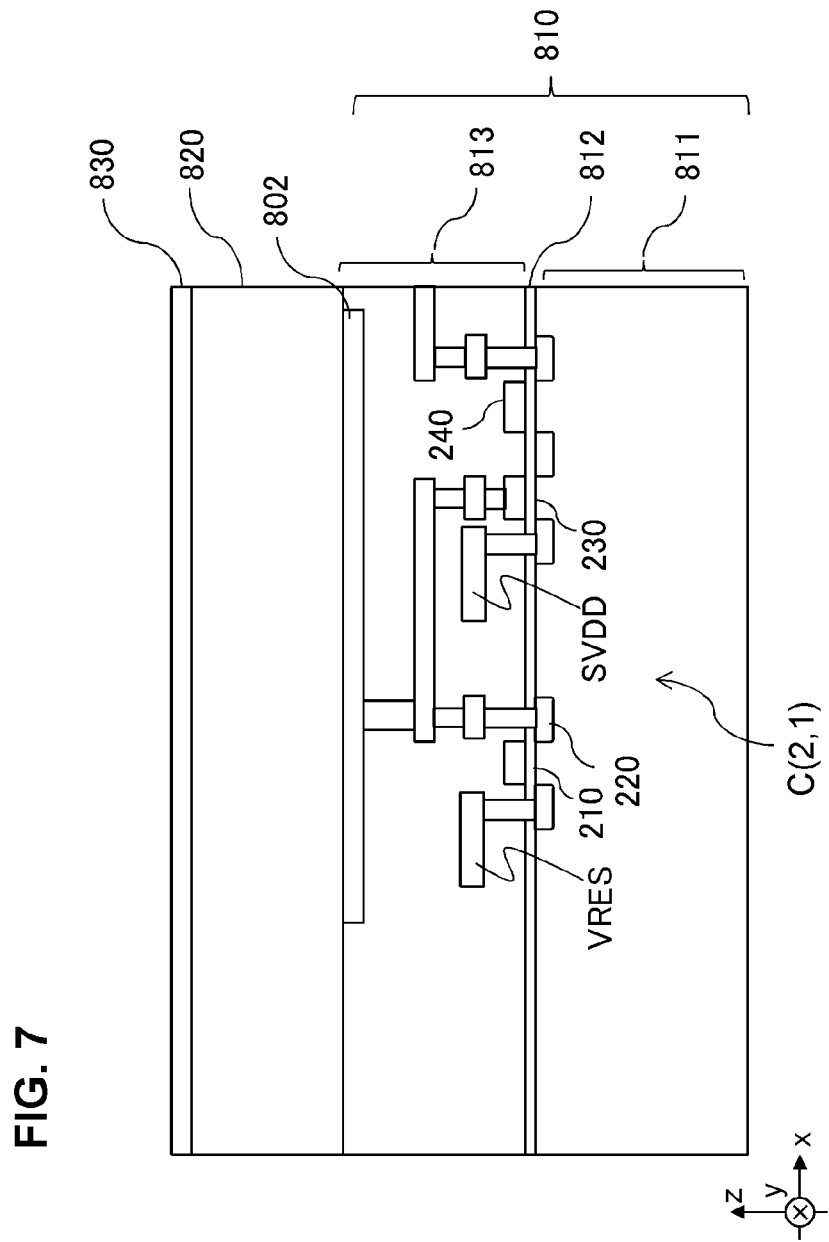

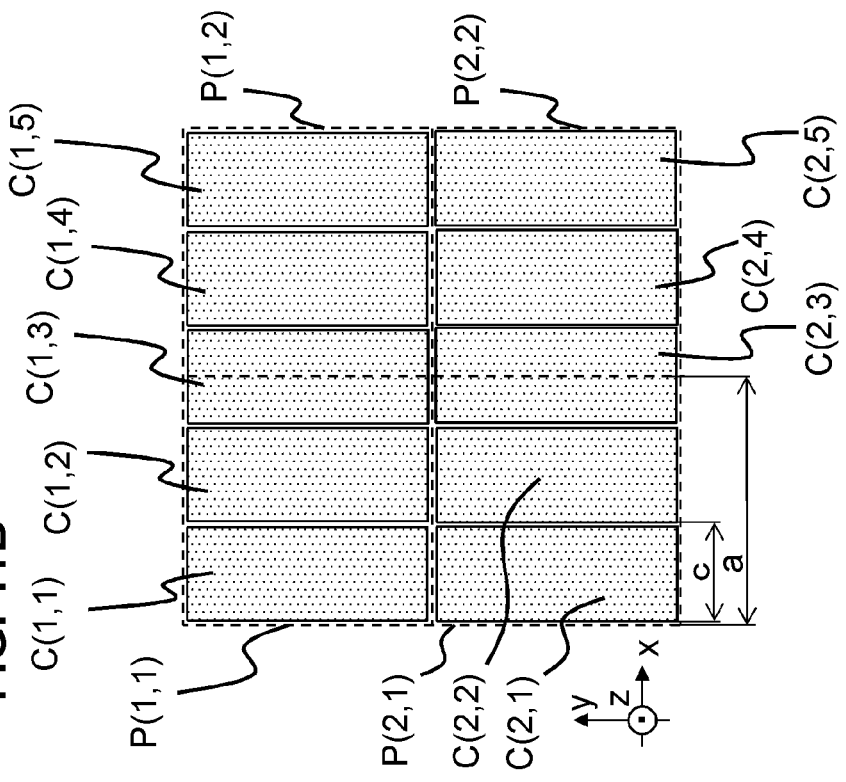
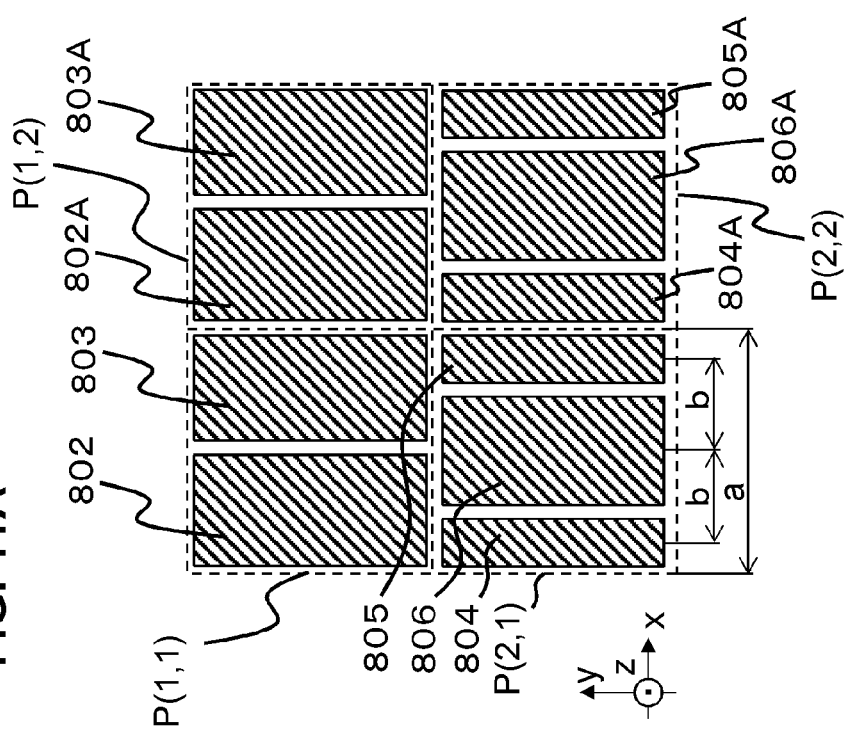

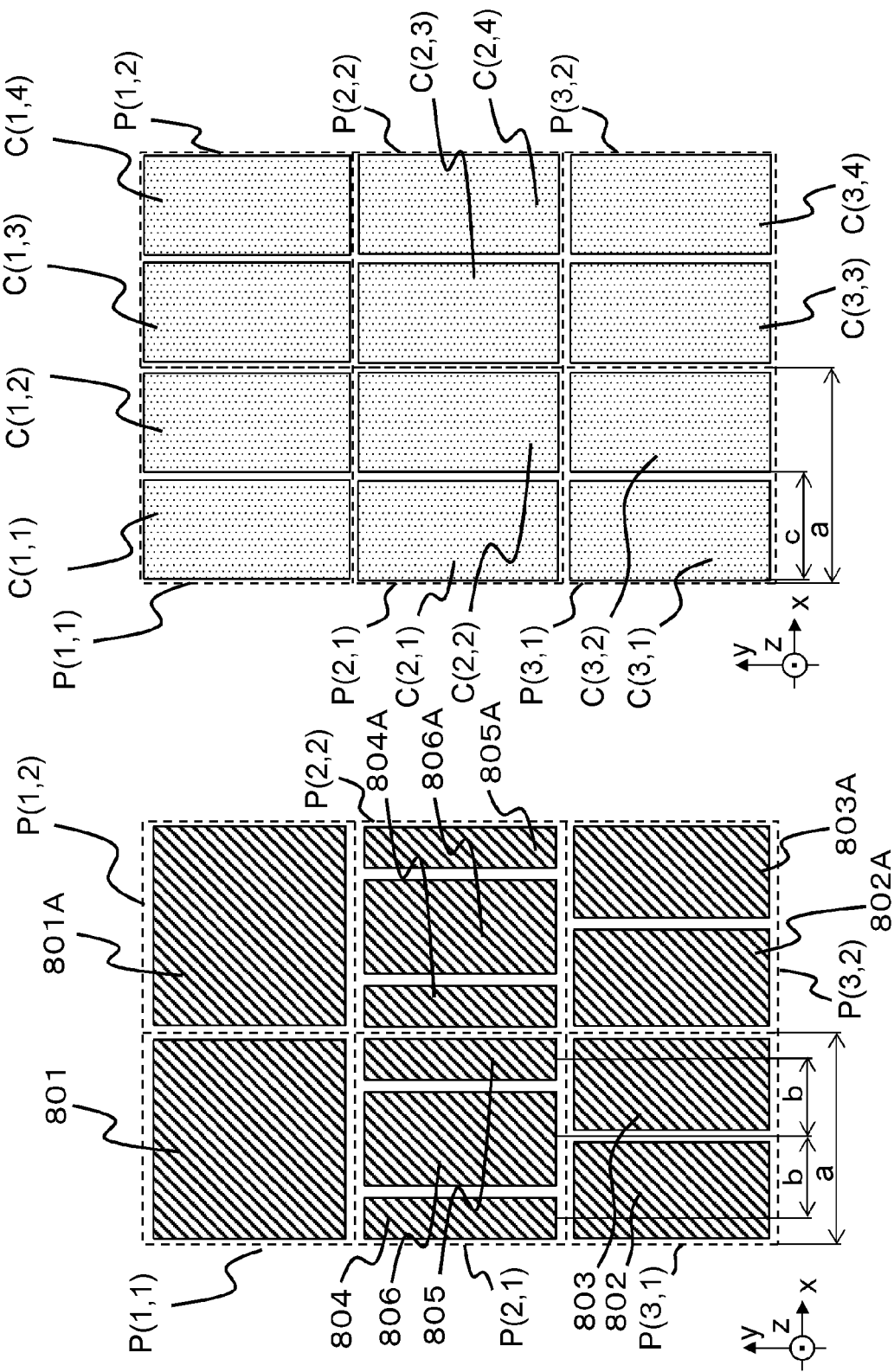

PHOTOELECTRIC CONVERSION DEVICE, PHOTOELECTRIC CONVERSION SYSTEM, AND MOVABLE BODY

BACKGROUND OF THE INVENTION

Field of the Invention

The present invention relates to a photoelectric conversion device, a photoelectric conversion system, and a movable body.

Description of the Related Art

Conventionally, as a photoelectric conversion device, there is known a configuration having a pixel that includes a light receiving section in which a photoelectric conversion layer is provided on a substrate. Japanese Patent Application Publication No. 2015-207594 describes a photoelectric conversion device that uses an organic photoelectric conversion layer as the photoelectric conversion layer. On the other hand, a photoelectric conversion system having an autofocus (AF) function that automatically performs focus adjustment in photographing is widely used. Japanese Patent Application Publication No. 2015-207594 indicates that two pixel electrodes that are laterally separated are provided below one microlens, and focus detection is performed by using a phase difference method. In the phase difference method, a defocus amount and a distance to a subject are determined from a phase difference of light fluxes having passed through different areas (pupil areas) on the pupil of a lens by using the principle of triangulation.

It is desired to achieve high accuracy in distance measurement as well as photoelectric conversion in Japanese Patent Application Publication No. 2015-207594. In order to achieve high accuracy in distance measurement as well as photoelectric conversion, it is conceivable to use a photoelectric conversion device in which a plurality of pixel groups each having a pixel for photoelectric conversion and a pixel for distance measurement that have different numbers of electrodes are repeatedly disposed on a substrate two-dimensionally.

However, when the number of electrodes is increased, the number of pixel circuits connected to the electrodes is also increased, and it is feared that the arrangement of the pixel circuits will be complicated. When the arrangement of the pixel circuits is complicated, the size of an area in which the pixel circuits are arranged is increased, the number of pixels that can be arranged on a substrate having a predetermined size is limited, and it becomes difficult to achieve high definition of a captured image.

SUMMARY OF THE INVENTION

The present invention has been made in view of the above circumstances, and an object thereof is to provide a technique capable of simplifying the arrangement of pixel circuits connected to electrodes and achieving high definition of a captured image in a photoelectric conversion device having a plurality of pixels each having a plurality of electrodes disposed therein.

The first aspect of the disclosure is a photoelectric conversion device in which a plurality of pixels are arranged in a matrix, wherein each of the pixels includes: at least one pixel electrode, a photoelectric conversion layer that is provided on the pixel electrode, a counter electrode that is provided on the photoelectric conversion layer, and a pixel circuit that is connected to the pixel electrode and outputs a signal from the pixel electrode, wherein a pixel circuit group corresponding to a pixel group formed of the plurality of pixels positioned adjacent to each other is disposed below a pixel electrode group of the pixel group, wherein the pixel group includes a first pixel, and a second pixel having more independent pixel electrodes than the first pixel, the independent pixel electrodes being pixel electrodes controllable independently, wherein each of a plurality of the pixel circuits is connected to each of a plurality of the independent pixel electrodes, and wherein the first pixel overlaps with the pixel circuit that corresponds to the first pixel, and with the pixel circuit that does not correspond to the first pixel in a plan view.

The second aspect of the disclosure is a photoelectric conversion device in which a plurality of pixels are arranged in a matrix, wherein each of the pixels includes: at least one pixel electrode, a photoelectric conversion layer that is provided on the pixel electrode, a counter electrode that is provided on the photoelectric conversion layer, and a pixel circuit that is connected to the pixel electrode and outputs a signal from the pixel electrode, wherein a pixel circuit group corresponding to a pixel group formed of the plurality of pixels positioned adjacent to each other is disposed below a pixel electrode group of the pixel group, wherein the pixel group includes a first pixel, and a second pixel having more independent pixel electrodes than the first pixel, the independent pixel electrodes being pixel electrodes controllable independently, wherein each of a plurality of the pixel circuits is connected to each of a plurality of the independent pixel electrodes, and wherein a pitch of the pixel circuit of the pixel circuit group is larger than a pitch of the independent pixel electrode of the second pixel, and the pitch of the pixel circuit of the pixel circuit group is smaller than a pitch of the pixel of the pixel group in an arrangement direction in which the independent pixel electrodes of the second pixel are arranged.

According to the present invention, in the photoelectric conversion device having the plurality of pixels each having the plurality of electrodes disposed therein, it becomes possible to simplify the arrangement of the pixel circuits connected to the electrodes and achieve high definition of the captured image.

Further features of the present invention will become apparent from the following description of exemplary embodiments with reference to the attached drawings.

BRIEF DESCRIPTION OF THE DRAWINGS

FIGS. 4A and 4B are views each schematically showing the pixel according to the embodiment;

FIG. 7 is a view for explaining an example of the structure of the pixel circuit of the embodiment;

FIGS. 11A and 11B are views each schematically showing Arrangement Example 3 of the pixel according to the embodiment;

FIGS. 12A and 12B are views each schematically showing Arrangement Example 4 of the pixel according to the embodiment;

DESCRIPTION OF THE EMBODIMENTS

Hereinbelow, a description will be given of an example of a specific embodiment of a photoelectric conversion device according to the present invention with reference to the drawings. The photoelectric conversion device is a semiconductor device that has a plurality of pixels that convert light to electrical signals, and is also referred to as a solid state image device or an image sensor. The photoelectric conversion device includes a CCD image sensor and a CMOS image sensor. Note that, with regard to part of the photoelectric conversion device that is not depicted or described particularly in the present embodiment, it is possible to use the well-known or known art of the corresponding technical field. In addition, the materials, shapes, and relative arrangement of components described in the present embodiment should be changed appropriately according to the configuration of a device to which the invention is applied and various conditions, and the scope of the invention is not limited to the following embodiment.

<Overall Configuration of Photoelectric Conversion Device>

Figure 1:
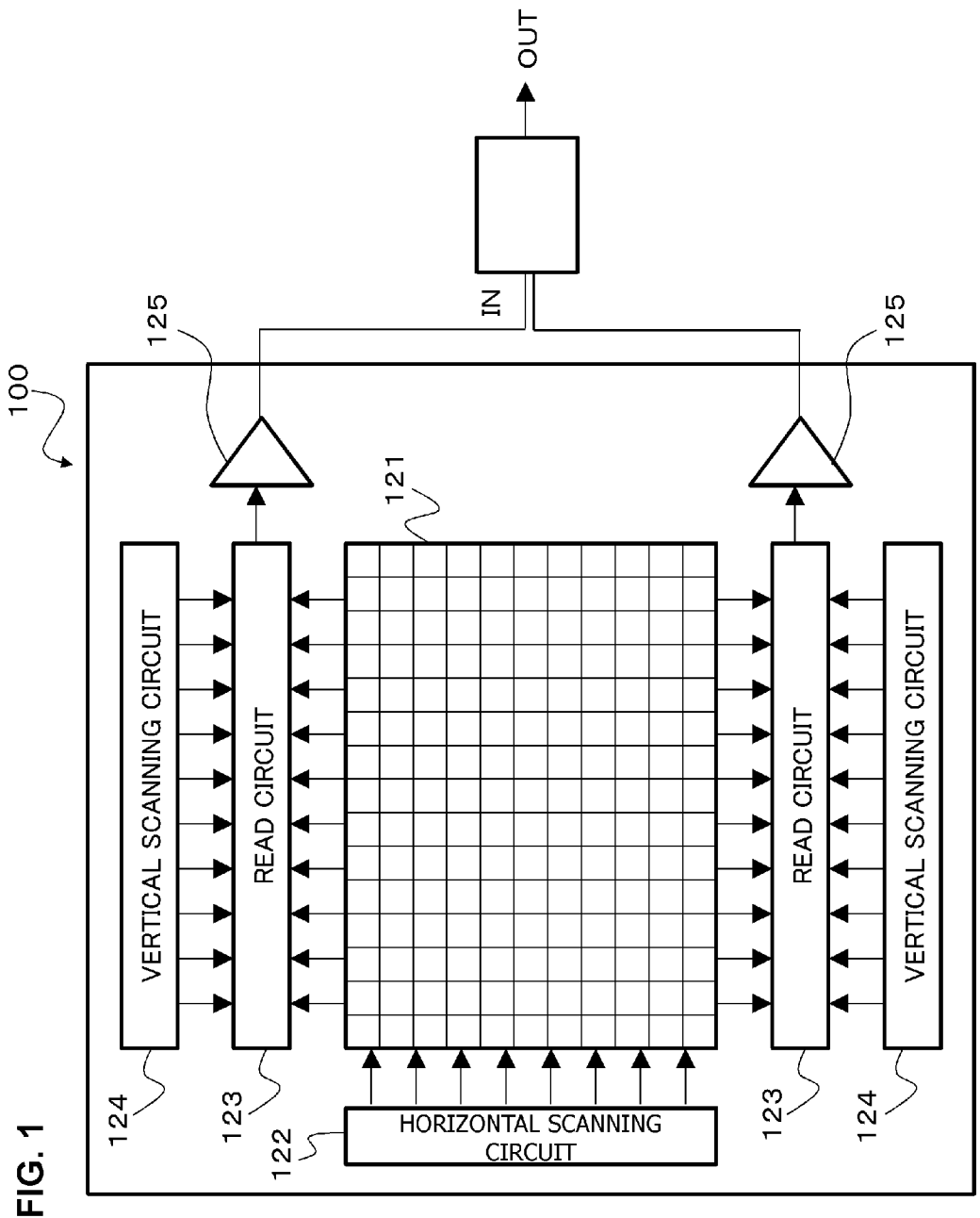
FIG. 1 is a block diagram of a photoelectric conversion device according to an embodiment.

FIG. 1 is a block diagram of a photoelectric conversion device 100 according to the present embodiment.

A photoelectric conversion device 100 includes a pixel area 121, a vertical scanning circuit 122, two read circuits 123, two horizontal scanning circuits 124, and two output amplifiers 125. The vertical scanning circuit 122, the two read circuits 123, the two horizontal scanning circuits 124, and the two output amplifiers 125 are provided in a peripheral circuit area that is an area other than the pixel area 121.

In the pixel area 121, a large number of pixels are arranged in a matrix (two-dimensional shape). Each read circuit 123 is provided with, e.g., a column amplifier, a correlated double sampling (CDS) circuit, and an addition circuit, and performs amplification and addition on a signal read from a pixel in a row selected by the vertical scanning circuit 122 via a vertical signal line (column signal line). The horizontal scanning circuit 124 generates a signal for sequentially reading a signal based on a pixel signal from the read circuit 123. The output amplifier 125 amplifies and outputs a signal in a column selected by the horizontal scanning circuit 124. In the following description, a configuration in which an electron is used as a signal charge will be described as an example, but it is also possible to use a positive hole as the signal charge.

<Device Configuration of Each Pixel>

The present embodiment relates to the relative disposition between a pixel circuit connected to a pixel electrode of a pixel, and the pixel. Accordingly, the present embodiment will be described on the assumption that the pixel circuit corresponding to the pixel is not included in the configuration of the pixel.

Figure 2B:
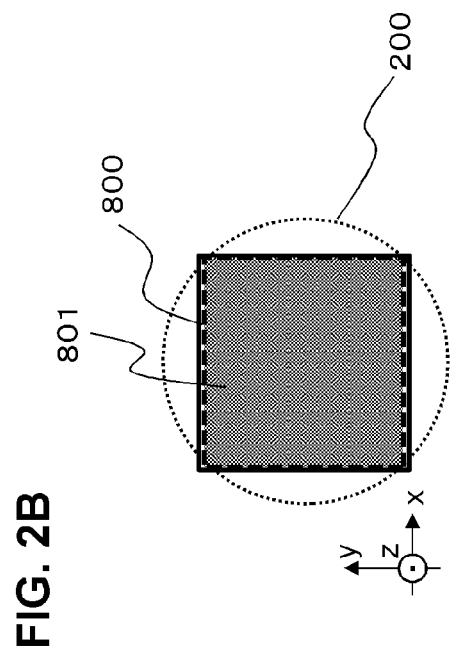
FIGS. 2A and 2B are views each schematically showing a pixel according to the embodiment.
Figure 2A:
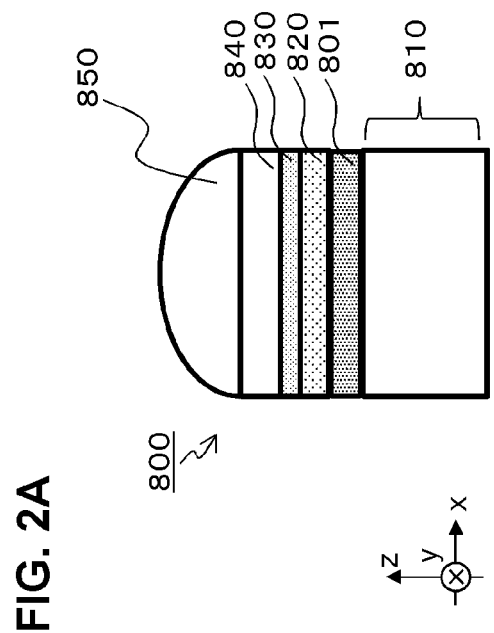

FIG. 2A is a cross-sectional view schematically showing an xz plane of a pixel 800 of the present embodiment. FIG. 2B is a cross-sectional view schematically showing an xy plane of an electrode 801 in the pixel 800. Note that, in the present embodiment, x and y axes orthogonal to each other are set in a plane parallel to the surface of a substrate (semiconductor substrate) on which the pixel is disposed, and a z axis is set in a direction perpendicular to the surface of the substrate in the following description. In addition, there are cases where the positive direction of the z axis is referred to as above, and the negative direction of the z axis is referred to as below. Further, as will be described later, in the case where the pixel has a plurality of lower electrodes, an arrangement direction in which the plurality of lower electrodes are arranged is referred to as an x direction. Furthermore, there are cases where a view in which the xy plane of an element of the pixel is viewed from above in the z axis as shown in FIG. 2B is referred to as a plan view. In addition, there are cases where a view in which each element constituting the pixel is orthogonally projected onto the xy plane (the surface of the substrate or a plane parallel to the surface of the substrate) is referred to as a plan view.

As shown in FIG. 2A, the pixel 800 includes a pixel electrode (lower electrode, hereinafter referred to as an electrode) 801, a photoelectric conversion layer 820, a counter electrode (upper electrode) 830, a color filter 840, and a microlens 850.

The electrode 801 is provided on a member 810, the photoelectric conversion layer 820 is provided on the electrode 801, and the counter electrode 830 is provided on the photoelectric conversion layer 820. The photoelectric conversion layer 820 is disposed so as to be held between the electrode 801 and the counter electrode 830. The color filter 840 is provided on the counter electrode 830, and the microlens 850 is provided on the color filter 840.

A portion in which the substrate, a plurality of insulating films, a wiring layer including wiring, and the read circuit are disposed is schematically shown as the member 810. A layer constituting the insulating films is formed of, e.g., silicon oxide, BPSG, PSG, BSG, silicon nitride, or silicon carbide. In the wiring, a conductive material such as copper, aluminum, tungsten, tantalum, titanium, or polysilicon is used.

The electrode 801 is a thin film electrode, and is formed of a transparent or opaque conductive member such as indium tin oxide (ITO) or aluminum. The electrode 801 is used for separating and collecting charges generated in each area of the photoelectric conversion layer 820.

The photoelectric conversion layer 820 contains an organic compound that generates charges corresponding to the amount of light of incident light. A functional layer such as a charge blocking layer that prevents charges from being injected into the photoelectric conversion layer 820 from the electrode may be provided between the photoelectric conversion layer 820 and the electrode 801 or between the photoelectric conversion layer 820 and the counter electrode 830.

The counter electrode 830 is the electrode that faces the electrode 801, and is provided so as to cover the photoelectric conversion layer 820. The counter electrode 830 is the electrode for applying voltage to the photoelectric conversion layer 820 to generate an electric field in the photoelectric conversion layer 820. The counter electrode 830 is provided so as to be closer to the side of a light incident surface than the photoelectric conversion layer 820, and hence the counter electrode 830 is formed of a transparent conductive material such as ITO that allows passage of incident light.

The color filter 840 is the filter that transmits R (red), G (green), and B (blue) light, or C (cyan), M (magenta), and Y (yellow) light. The color filter 840 may be a white filter or an IR filter that transmits light having wavelengths of RGB or CMY. In particular, in the case where distance measurement is performed, it is not necessary to identify color, and hence, when the white filter is used in a pixel for distance measurement, sensitivity is improved. In the case where a plurality of types of the color filters 840 are used and a step is formed between the color filters, a planarization layer may be provided on the color filter 840.

The microlens 850 is formed by using a material such as a resin. For example, an area in which one microlens is provided can be defined as one pixel. FIG. 2B shows the electrode 801 of the pixel 800 and an outer edge 200 of the microlens 850. A signal read from the electrode 801 is used as a signal for imaging.

Figure 3B:
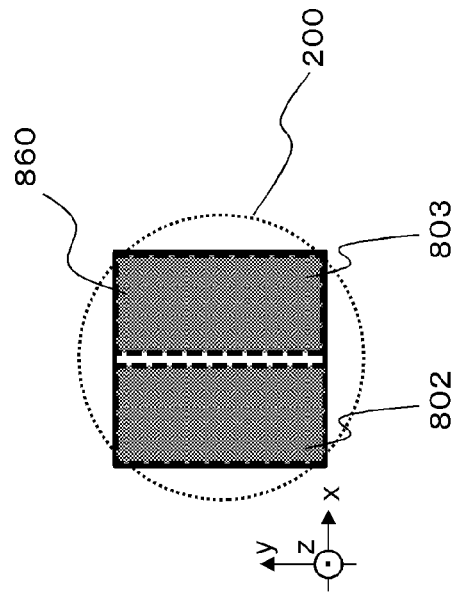
FIGS. 3A and 3B are views each schematically showing the pixel according to the embodiment.
Figure 3A:
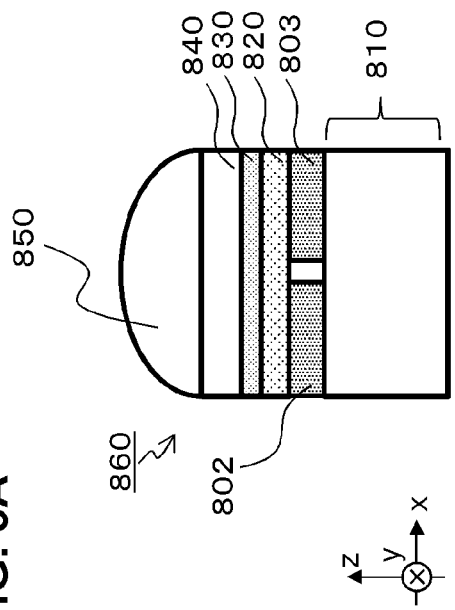

FIGS. 3A and 3B are views each showing a pixel 860 obtained by providing two electrodes, i.e., an electrode 802 and an electrode 803 in the pixel 800 of each of FIGS. 2A and 2B. Herein, the electrode 802 (first independent pixel electrode) and the electrode 803 (second independent pixel electrode) are used for detecting a phase difference.

As shown in FIG. 3B, in the x direction, the electrode 802 and the electrode 803 are arranged side by side so as to face each other, and the x direction serving as the arrangement direction is a phase difference detection direction. In the present embodiment, the width of the electrode 802 and the width of the electrode 803 in the x direction are substantially equal to each other. The effect of preventing variations in manufacturing is obtained by making the widths of the electrodes substantially equal to each other. Signals from the electrode 802 and the electrode 803 are used as signals for phase difference detection, but may also be used as signals for imaging.

FIGS. 4A and 4B are views each showing a pixel 870 obtained by providing three electrodes, i.e., an electrode 804 (first independent pixel electrode), an electrode 805 (second independent pixel electrode), and an electrode 806 (third independent pixel electrode) in the pixel 800 of each of FIGS. 2A and 2B.

As shown in FIG. 4B, the electrode 806 is disposed between the electrode 804 and the electrode 805. As shown in FIG. 4B, the electrode 804 is disposed at one end portion of the pixel 870 in the x direction, and the electrode 805 is disposed at the other end portion of the pixel 870 in the x direction. In this manner, the electrode 804 and the electrode 805 are disposed so as to face each other in the x direction, and the x direction is the phase difference detection direction. The phase difference detection is performed based on signals read from the electrode 804 and the electrode 805, and acquisition of distance information is performed. In addition, a signal read from the electrode 806 is used as the signal for imaging. The electrode 804 and the electrode 805 are spaced apart from each other by a distance corresponding to the electrode 806, and hence it is possible to increase the length of a base line and, as a result, it is possible to improve accuracy in distance measurement.

In a y direction, the lengths of the electrode 804, the electrode 805, and the electrode 806 are substantially equal to each other. Herein, being substantially equal to each other is a concept that includes a difference in length that is regarded as an error in manufacturing. When the length of the electrode 806 is made shorter than the length of each of the electrode 804 and the electrode 805 in the y direction, it is feared that part of generated signal charges can't be collected, and will be wasted.

Not only the signal read from the electrode 806 but also the signals read from the electrode 804 and the electrode 805 may be used as the signals for imaging. With this, it becomes possible to form an image having higher sensitivity.

Note that, in FIG. 4B, the width of the electrode 806 is larger than the width of each of the electrode 804 and the electrode 805 in the x direction, but the width of the electrode 806 is not limited thereto, and the width of the electrode 806 may be smaller than the width of each of the electrode 804 and the electrode 805. Also in this case, it is possible to provide the photoelectric conversion device having improved sensitivity while securing a certain length of the base line.

Hereinbelow, a description will be given of examples of an arrangement of a plurality of pixels in the pixel area 121 shown in FIG. 1 by using Arrangement Examples 1 to 6. Note that, in Arrangement Examples 1 to 6, there are cases where components identical to those of the above embodiment and components common to Arrangement Examples 1 to 6 are designated by the same reference numerals, and the description thereof will be omitted.

Arrangement Example 1

Figure 5A:
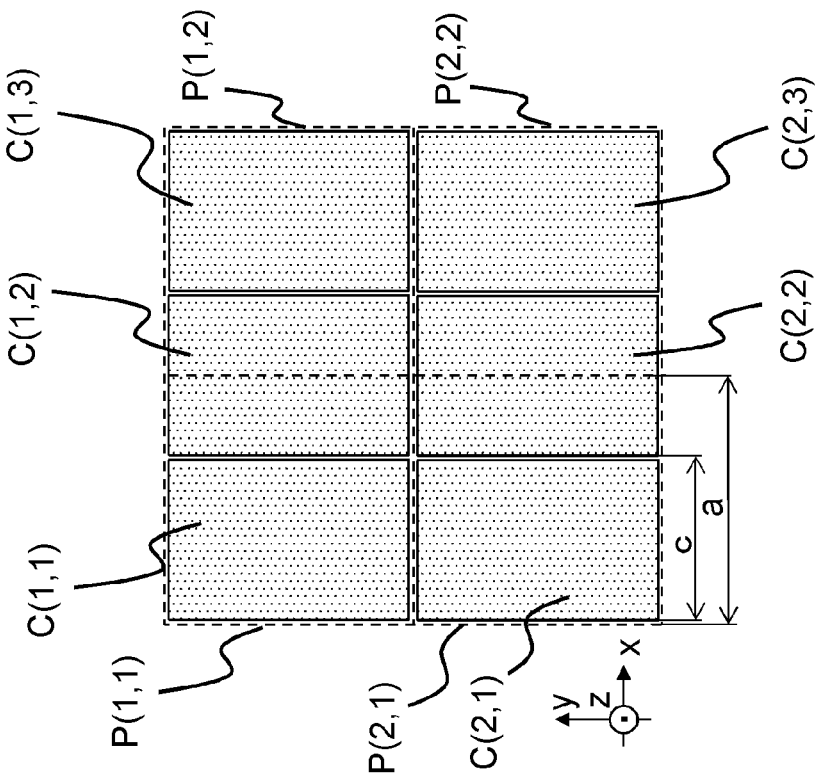
FIGS. 5A and 5B are views each schematically showing Arrangement Example 1 of the pixel according to the embodiment.

FIG. 5A is a view showing an example in which the pixels 800 and 860 shown in FIG. 2B and FIG. 3B are combined and arranged in two rows and two columns, and schematically showing the xy plane of each electrode of each pixel. In FIG. 5A, the pixel disposed at each position is indicated by P (m, n). Herein, m denotes the number of the row, and n denotes the number of the column. In addition, as shown in FIG. 5A, the pixels are arranged such that the row direction (lateral direction) of the matrix is the x direction, and the column direction (vertical direction) is the y direction.

In the pixel group of the present arrangement example shown in FIG. 5A, the pixel 800 having the electrode 801 shown in FIG. 2B is disposed as a pixel P (1, 1). Similarly to the pixel P (1, 1), the pixel 800 having an electrode 801A identical to the electrode 801 shown in FIG. 2B is disposed as a pixel P (1, 2). The pixel 860 having the electrode 802 and the electrode 803 shown in FIG. 3B is disposed as a pixel P (2, 1). Similarly to the pixel P (2, 1), the pixel 860 having electrodes 802A and 803A identical to the electrodes 802 and 803 shown in FIG. 3B is disposed as a pixel P (2, 2). FIG. 5A shows only the arrangement of two rows and two columns, but a plurality of the pixel groups each formed of the pixel P (1, 1) and the pixel P (2, 1) are repeatedly disposed in the pixel area 121 in FIG. 1.

In the pixel P (2, 1), the electrode 802 and the electrode 803 are disposed so as to face each other in the x direction, and the x direction is the phase difference detection direction. The phase difference detection is performed based on the signals read from the electrode 802 and the electrode 803, and the acquisition of the distance information is performed. Also in the pixel P (2, 2), the electrode 802A and the electrode 803A are disposed so as to face each other in the x direction, and the x direction is the phase difference detection direction. The phase difference detection is performed based on the signals read from the electrode 802A and the electrode 803A, and the acquisition of the distance information is performed.

Figure 5B:
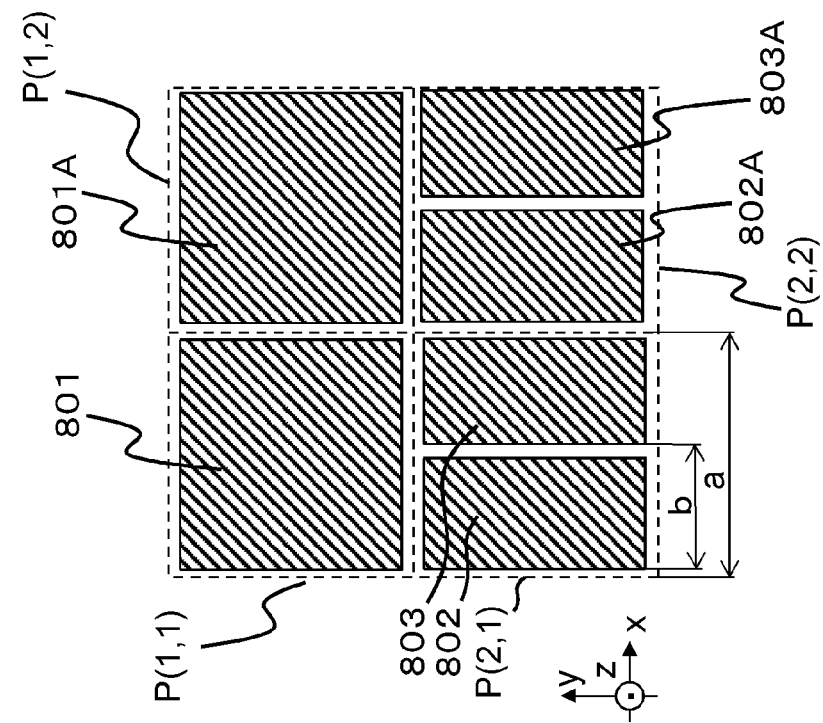

FIG. 5B is a view showing the pixel circuits arranged in two rows and three columns correspondingly to the pixel group shown in FIG. 5A, and shows a plan view of the pixel group and the pixel circuit group. In FIG. 5B, the pixel circuit disposed at each position is indicated by C (m, n). Herein, m denotes the number of the row, and n denotes the number of the column.

Each of the number of pixel electrodes disposed in the pixels arranged in two rows and two columns shown in FIG. 5A and the number of pixel circuits shown in FIG. 5B is six, and the pixel circuit group arranged in two rows and three columns is disposed below the electrode group (pixel electrode group) of the pixel group arranged in two rows and two columns in a z direction (the positive direction of the z axis). In particular, in the present embodiment, the pixel group arranged in two rows and two columns and the pixel circuit group arranged in two rows and three columns are disposed so as to overlap each other in the z direction (overlapping arrangement). Herein, overlapping each other in the z direction means overlapping each other in the plan view or overlapping each other in the case where the pixel group and the pixel circuit group are orthogonally projected onto the xy plane. In addition, in the plan view, the sizes of the areas in which the individual pixel circuits are disposed are configured to be substantially equal to each other.

Hereinbelow, a description will be given of a correspondence between the electrode and the pixel circuit. The pixel circuits are provided so as to correspond to the individual electrodes 801, 802, 803, 801A, 802A, and 803A. Note that, in the following description, a is a pitch between two adjacent pixels, b is a pitch between two adjacent electrodes, and c is a pitch between two adjacent pixel circuits.

In the present arrangement example, the electrode 801 is connected to a pixel circuit C (1, 1), the electrode 802 is connected to a pixel circuit C (2, 1), and the electrode 803 is connected to a pixel circuit C (2, 2). In addition, the electrode 801A is connected to a pixel circuit C (1, 3), the electrode 802A is connected to a pixel circuit C (1, 2), and the electrode 803A is connected to a pixel circuit C (2, 3). Herein, in the arrangement example, the pixel P (1, 1) corresponds to a first pixel, and the pixel (2, 2) corresponds to a second pixel.

In the present arrangement example, in the x direction, the pitch c of the pixel circuit is different from and smaller than the pitch a of the pixel, and corresponds to ⅔ of the pitch a of the pixel. In addition, in the x direction, the pitch c of the pixel circuit is larger than the pitch b between the electrode 802 and the electrode 803. In the y direction, the pitch of the pixel circuit is equal to the pitch of the pixel.

In the z direction, the pixel P (1, 1) is disposed so as to overlap the pixel circuit C (1, 1) connected to the electrode 801, and overlap the pixel circuit C (1, 2) connected to the electrode 802A of the pixel P (2, 2) different from the pixel P (1, 1). At this point, as in the plan view shown in FIG. 5B, an area in which the pixel P (1, 1) indicated by a dotted line is positioned (an area defined by orthogonally projecting the pixel P (1, 1) onto the xy plane) preferably includes the entire area in which the pixel circuit C (1, 1) is positioned (an area defined by orthogonally projecting the pixel circuit C (1, 1) onto the xy plane).

Hereinbelow, a description will be given of each of the pixel circuit and the read circuit in the present arrangement example.

<Pixel Circuit>

Figure 6A:
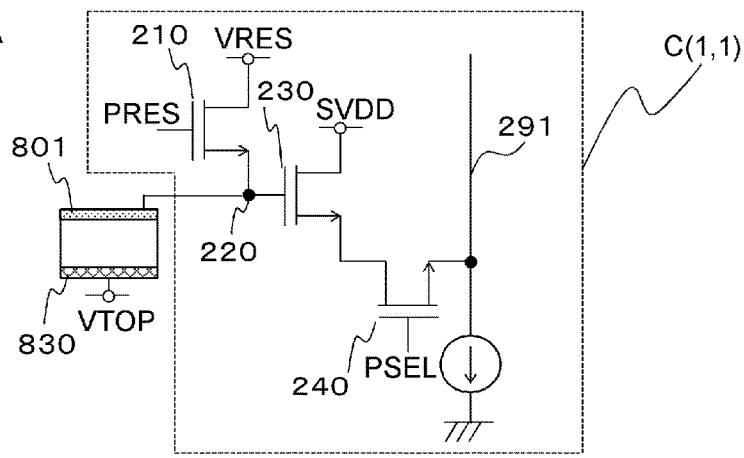
FIGS. 6A and 6B are examples of an equivalent circuit diagram of a pixel circuit of the embodiment.
Figure 6B:
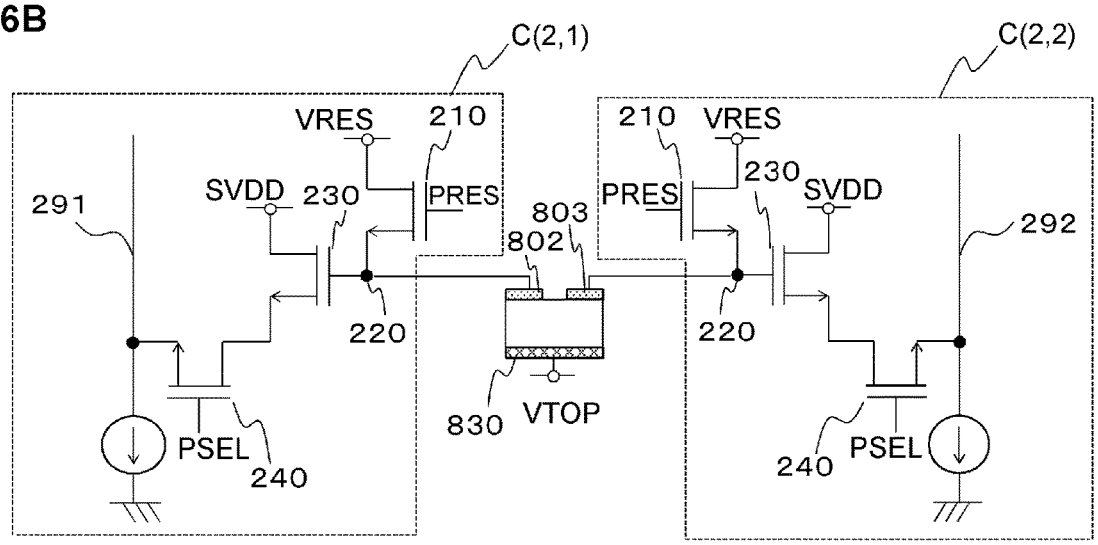

Each of FIGS. 6A and 6B shows an example of an equivalent circuit diagram of the pixel circuit provided correspondingly to each electrode. FIG. 6A is the equivalent circuit diagram of the pixel circuit C (1, 1) connected to the electrode 801 of the pixel P (1, 1), and FIG. 6B is the equivalent circuit diagram of the pixel circuits C (2, 1) and C (2, 2) connected to the electrodes 802 and 803 of the pixel P (2, 1).

FIG. 7 is a view for explaining an example of the structure of the pixel circuit C (2, 1) connected to the electrode 802 of the pixel P (2, 1), and is a cross-sectional view schematically showing the member 810, the electrode 802, the photoelectric conversion layer 820, and the counter electrode 830.

As shown in FIGS. 6A and 6B, the configurations of the pixel circuits corresponding to the individual electrodes are the same, and hence, in the following description, a description will be given of the pixel circuit C (2, 1) connected to the electrode 802 shown in each of FIG. 6B and FIG. 7.

As shown in FIG. 6B and FIG. 7, the electrode 802 is connected to the gate of an amplification transistor 230 via a floating diffusion (FD) 220. The FD 220 is configured such that a reset potential VRES can be written into the FD 220 via a reset transistor 210. The source of the amplification transistor 230 is connected to an output line 291 via a selection transistor 240. Herein, in FIGS. 6A and 6B, VTOP indicates a voltage supplied to the counter electrode 830, PRES indicates a reset signal, PSEL indicates a selection signal, and SVDD indicates a power supply voltage (reference power supply).

In addition, as shown in FIG. 7, the pixel circuit C (2, 1) connected to the electrode 802 of the pixel P (2, 1) is disposed in an area of the member 810 positioned below the electrode 802 in the z direction. The member 810 is constituted by a substrate 811, an oxide film (gate oxide film) 812, and a wiring layer 813.

That the pixel overlaps the pixel circuit in the z direction will be described in greater detail.

That the pixel overlaps the pixel circuit in the z direction means that the area in which the pixel is positioned overlaps the area in which the pixel circuit is positioned in the plan view of FIG. 5B, as described above.

At this point, the electrode of the pixel preferably overlaps the pixel circuit in the z direction. In the case where the electrode overlaps the pixel circuit in the z direction, the electrode preferably overlaps, among the components of the pixel circuit, at least the amplification transistor in the z direction.

For example, in FIG. 7, that the electrode 802 overlaps the pixel circuit C (2, 1) connected to the electrode 802 in the z direction means that the electrode 802 overlap s the gate of the amplification transistor 230 in the z direction. In addition, in another example, that the electrode 802 overlaps the pixel circuit C (2, 1) in the z direction means that the electrode 802 overlaps the gate of the amplification transistor 230 and the gate of the reset transistor 210 in the z direction. Further, in another example, that the electrode 802 overlaps the pixel circuit C (2, 1) in the z direction means that the electrode 802 overlaps the gate of the amplification transistor 230, the gate of the reset transistor 210, and the gate of the selection transistor 240 in the z direction.

Thus, that the electrode 802 overlaps the pixel circuit C (2, 1) in the z direction may mean that the electrode 802 overlaps, among the gates of the amplification transistor 230, the reset transistor 210, and the selection transistor 240, at least the gate of the amplification transistor 230 in the z direction.

Figure 8:
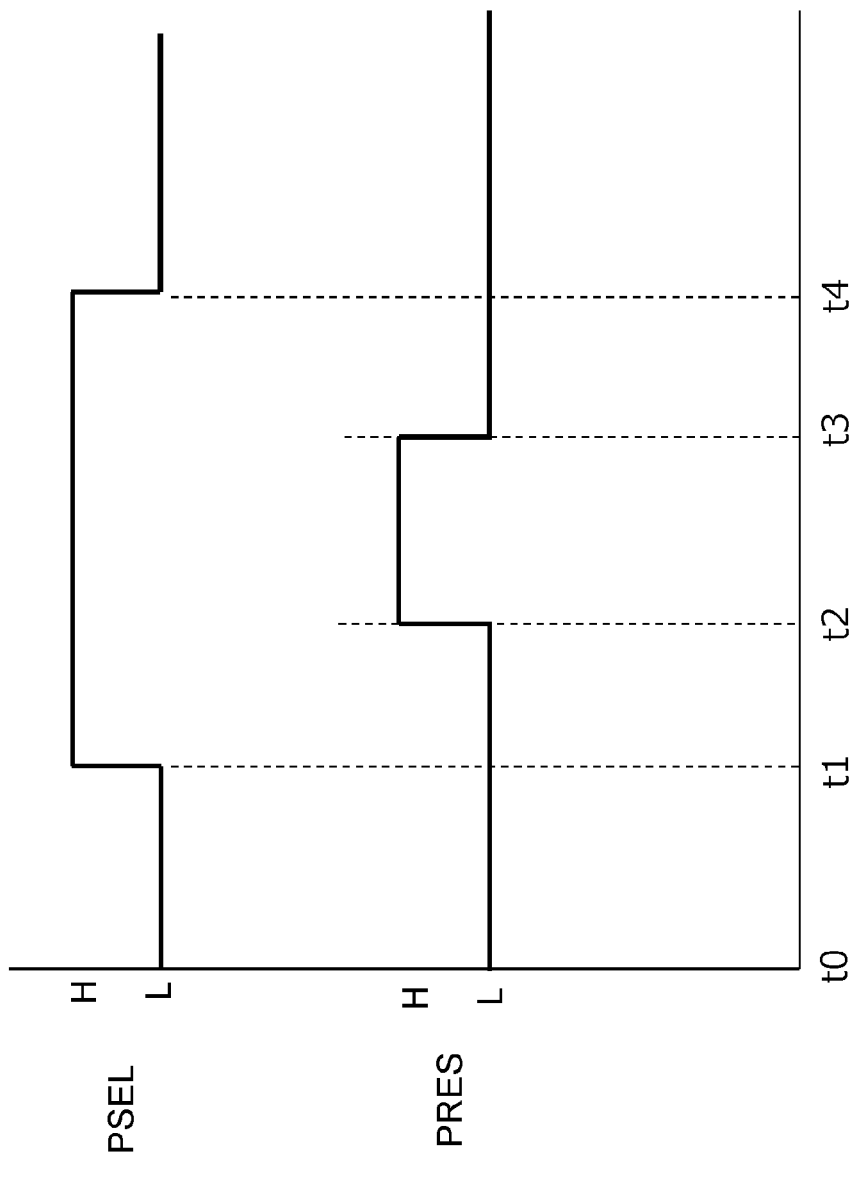
FIG. 8 is a view for explaining driving of the pixel circuit of the embodiment.

FIG. 8 is a view for explaining timing of driving of the pixel circuit shown in each of FIGS. 6A and 6B and FIG. 7.

Time t0 is any time at which charge storage is started. At time t1, the level of the selection signal PSEL is changed from a Low level (L level) to a High level (H level), and the selection transistor 240 is turned on. With this, the potential of a signal level (S signal) that is the potential corresponding to the FD 220 is output to the output line 291 via the amplification transistor 230 and the selection transistor 240.

Next, at time t2, the level of the reset signal PRES is changed from the L level to the H level, and the reset transistor 210 is turned on. With this, the reset potential VRES is written into the FD 220.

Next, at time t3, the level of the reset signal PRES is changed from the H level to the L level, and the reset transistor is turned off. With this, the potential of a reset level (N signal) that is the potential corresponding to the FD 220 is output to the output line 291 via the amplification transistor 230 and the selection transistor 240.

Lastly, at time t4, the level of the selection signal PSEL is changed from the H level to the L level, and the selection transistor 240 is turned off. With this, the charge storage is resumed.

Note that the above-described example has described the pixel circuit having three transistors that are the reset transistor 210, the amplification transistor 230, and the selection transistor 240, but the pixel circuit is not limited thereto. The present invention can be applied to the pixel circuit having any configuration that allows read of a photoelectric conversion signal.

<Read Circuit>

Figure 9:
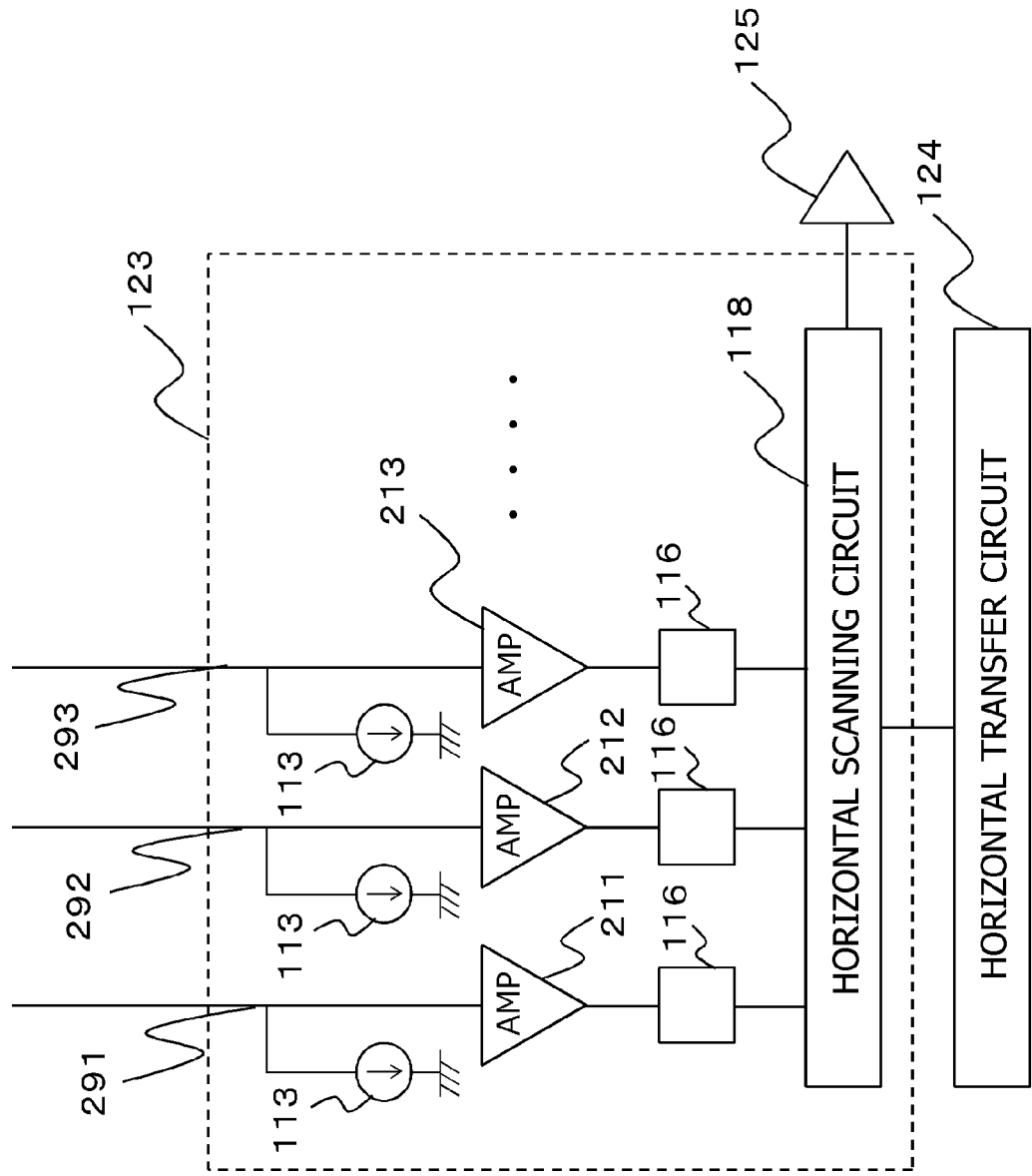
FIG. 9 is a view showing an example of the configuration of a read circuit of the embodiment.

FIG. 9 is a view showing an example of the configuration of the read circuit 123 shown in FIG. 1.

As shown in FIG. 9, the read circuit 123 includes output lines 291 to 293, constant current circuits 113, amplification circuits 211 to 213 corresponding to the output lines 291 to 293, signal storage sections 116, and a horizontal transfer circuit 118. The outputs of the pixel circuits C (1, 1) and C (2, 1) are connected to the output line 291. In addition, the outputs of the pixel circuits C (1, 2) and C (2, 2) are connected to the output line 292. Further, the outputs of pixel circuits C (1, 3) and C (2, 3) are connected to the output line 293. FIG. 9 also shows the horizontal scanning circuit 124 and the output amplifier 125. The constant current circuits 113 each serving as a load unit of the amplification transistor and the amplification circuits 211 to 213 are connected to the output lines 291 to 293, and the signal storage sections 116 are connected to the output nodes of the amplification circuits 211 to 213.

Each of the amplification circuits 211 to 213 amplifies the S signal and the N signal from the pixel circuit, and outputs them to the signal storage section 116. The signal storage section 116 stores the S signal and the N signal amplified in each of the amplification circuits 211 to 213. The S signal and the N signal stored in the signal storage section 116 are output to the horizontal transfer circuit 118 sequentially on a per column basis by using the horizontal scanning circuit 124, and are transmitted from the output amplifier 125 to a signal processing circuit (not shown). In the signal processing circuit, a difference signal between the S signal and the N signal is generated.

As described thus far, according to the present arrangement example, in the photoelectric conversion device having a plurality of the pixels each having a plurality of the electrodes disposed therein, it is possible to simplify the arrangement of the pixel circuits connected to the electrodes, and arrange the pixel circuits efficiently. With this, it is possible to further reduce space required to arrange the pixel circuits, and increase the number of pixels arranged on the substrate having a predetermined size. Consequently, it becomes possible to achieve high definition of a captured image. In addition, it is possible to further improve the yield of the photoelectric conversion device by simplifying the arrangement of the pixel circuits.

Arrangement Example 2

Figure 10A:
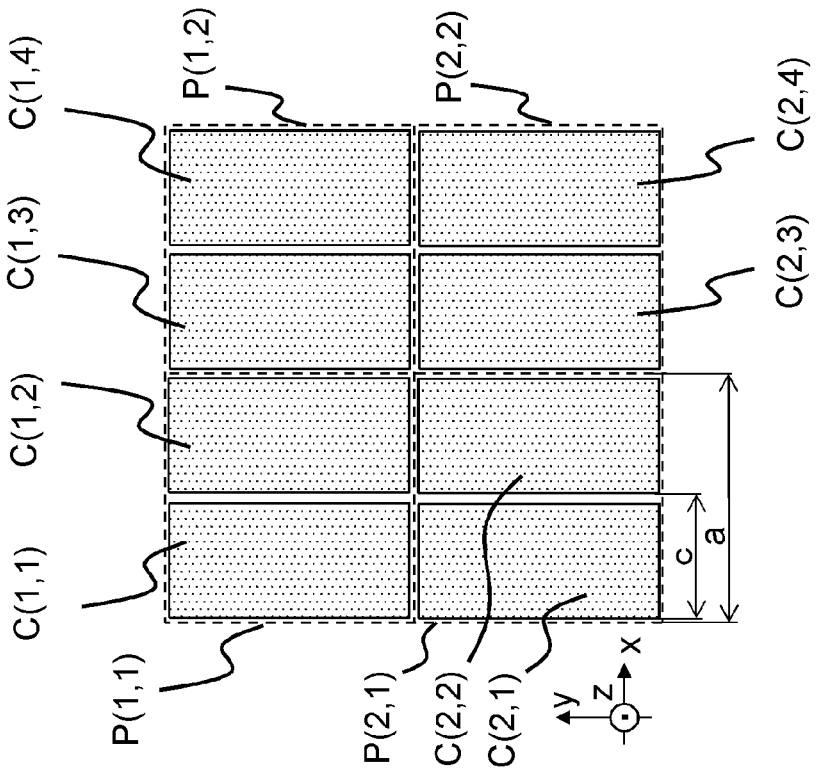
FIGS. 10A and 10B are views each schematically showing Arrangement Example 2 of the pixel according to the embodiment.

FIG. 10A is a view showing another example in which the pixels are arranged in two rows and two columns.

The pixel group of the present arrangement example shown in FIG. 10A is different from the pixel group shown in FIG. 5A in that the pixel 870 shown in each of FIGS. 4A and 4B is disposed as each of the pixel P (2, 1) and the pixel P (2, 2).

As shown in FIG. 10A, the pixel 870 shown in FIG. 4B is disposed as the pixel P (2, 1), and the electrodes 804, 805, and 806 are disposed. Similarly, the pixel 870 shown in FIG. 4B is disposed as the pixel P (2, 2), and electrodes 804A, 805A, and 806A identical to the electrodes 804, 805, and 806 are disposed. As described above, the electrode 806 is disposed between the electrode 804 and the electrode 805, and the electrode 806A is disposed between the electrode 804A and the electrode 805A. FIG. 10A shows only the arrangement of two rows and two columns, but a plurality of the pixel groups each formed of the pixel P (1, 1) and the pixel P (2, 1) are repeatedly disposed in the pixel area 121 in FIG. 1.

Also in the present arrangement example, similarly to the example shown in FIG. 5A, the phase difference detection is performed based on the signals read from the electrodes 804 and 805 and the electrodes 804A and 805A, and the acquisition of the distance information is performed. In the example shown in FIG. 10A, the electrode 804 and the electrode 805 or the electrode 804A and the electrode 805A are spaced apart from each other by a distance corresponding to the electrode 806 or the electrode 806A, and hence it is possible to make the length of the base line longer than that in the example shown in FIG. 5A and, as a result, it is possible to further improve accuracy in distance measurement.

Figure 10B:
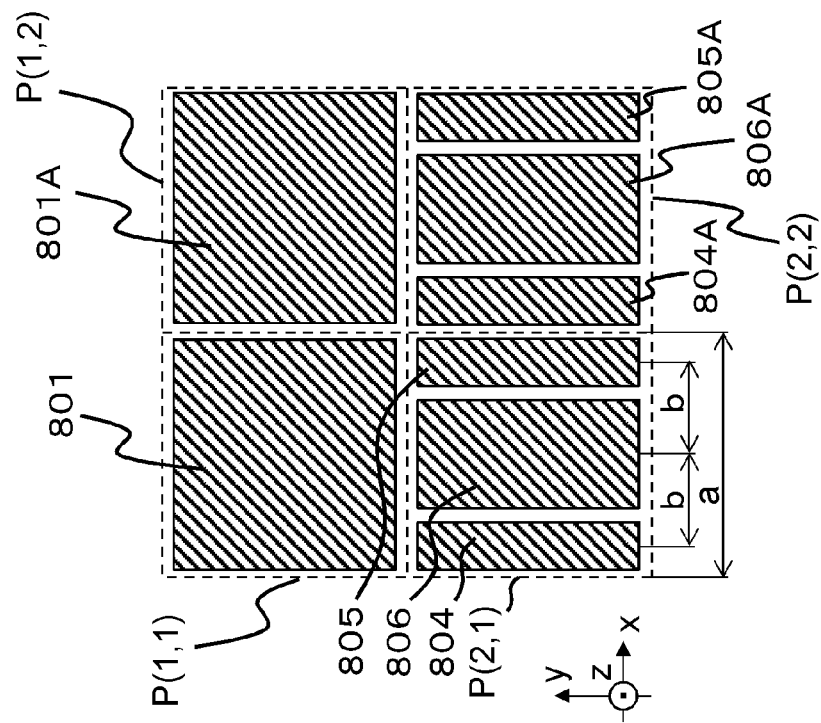

FIG. 10B is a view showing the pixel circuits arranged in two rows and four columns correspondingly to the pixel group shown in FIG. 10A, and shows a plan view of the pixel group and the pixel circuit group.

Each of the number of pixel electrodes disposed in the pixels arranged in two rows and two columns shown in FIG. 10A and the number of pixel circuits shown in FIG. 10B is eight, and the pixel circuit group arranged in two rows and four columns is disposed below the electrode group of the pixel group arranged in two rows and two columns in the z direction. The pixel group arranged in two rows and two columns and the pixel circuit group arranged in two rows and four columns are disposed so as to overlap each other in the z direction.

Hereinbelow, a description will be given of a correspondence between the electrode and the pixel circuit.

The pixel circuits are provided so as to correspond to the individual electrodes 801, 804, 805, 806, 801A, 804A, 805A, and 806A. For example, as Case 1, the electrode 801 is connected to the pixel circuit (1, 1), the electrode 804 is connected to the pixel circuit C (2, 1), the electrode 805 is connected to the pixel circuit C (2, 2), and the electrode 806 is connected to the pixel circuit C (1, 2). In addition, the electrode 801A is connected to the pixel circuit C (1, 3), the electrode 804A is connected to the pixel circuit C (2, 3), the electrode 805A is connected to a pixel circuit C (2, 4), and the electrode 806A is connected to a pixel circuit C (1, 4).

According to the connections, the pixel circuits C (2, 1) and C (2, 2) connected to the electrodes 804 and 805 that perform the acquisition of the distance information, and the pixel circuits C (2, 3) and C (2, 4) connected to the electrodes 804A and 805A that perform the acquisition of the distance information are disposed in the same row. With this configuration, it is possible to detect the signals for phase difference detection in the same storage period, and hence it is possible to improve accuracy in distance measurement.

In addition, as Case 2, the electrode 801 is connected to the pixel circuit C (1, 1), the electrode 804 is connected to the pixel circuit C (1, 2), the electrode 805 is connected to the pixel circuit C (2, 2), and the electrode 806 is connected to the pixel circuit C (2, 1). In addition, the electrode 801A is connected to the pixel circuit C (1, 3), the electrode 804A is connected to the pixel circuit C (1, 4), the electrode 805A is connected to the pixel circuit C (2, 4), and the electrode 806A is connected to the pixel circuit C (2, 3).

According to the connections, the pixel circuits C (1, 1) and C (2, 1) connected to the electrodes 801 and 806 that acquire photoelectric conversion information are disposed in the same column. In addition, the pixel circuits C (1, 3) and C (2, 3) connected to the electrodes 801A and 806A that acquire the photoelectric conversion information are disposed in the same column. Further, the pixel circuits C (1, 2) and C (2, 2) connected to the electrodes 804 and 805 that perform the acquisition of the distance information are disposed in the same column. In addition, the pixel circuits C (1, 4) and C (2, 4) connected to the electrodes 804A and 805A that perform the acquisition of the distance information are disposed in the same column. Thus, the column in which the pixel circuit connected to the electrode that acquires the photoelectric conversion information is disposed is different from the column in which the pixel circuit connected to the electrode that performs the acquisition of the distance information is disposed.

With this configuration, when the gain of the signal for imaging is made different from the gain of the signal for phase difference detection, the gain only needs to be changed for each of the amplification circuits 211 to 213 in FIG. 9. Consequently, it is possible to simplify the configuration of the read circuit.

In the present arrangement example, in the x direction, the pitch c of the pixel circuit is different from and smaller than the pitch a of the pixel, and corresponds to ½ of the pitch a of the pixel. In addition, in the x direction, the pitch c of the pixel circuit is larger than the pitch b between the electrode 804 and the electrode 806, or the pitch b between the electrode 805 and the electrode 806. In the y direction, the pitch of the pixel circuit is equal to the pitch of the pixel.

In FIG. 5A of Arrangement Example 1, since the length of the electrode 802 is equal to the length of the electrode 803 in the x direction, the distance between the end edges of one of the two electrodes that is positioned on the left in FIG. 5A is shown as the pitch b between the electrode 802 and the electrode 803. In contrast to this, in the present arrangement example, the electrode 804 is different in length from the electrode 806 in the x direction. Accordingly, in FIG. 10A, the pitch b between the electrode 804 and the electrode 806 is shown as the distance between the centers of the two electrodes in the x direction. The same applies to the pitch b between the electrode 805 and the electrode 806.

In addition, in Case 1, in the z direction, the pixel P (1, 1) is disposed so as to overlap the pixel circuit C (1, 1) connected to the electrode 801, and overlap the pixel circuit C (1, 2) connected to the electrode 806 of the pixel P (2, 1) different from the pixel P (1, 1). In Case 2, in the z direction, the pixel P (1, 1) is disposed so as to overlap the pixel circuit C (1, 1) connected to the electrode 801, and overlap the pixel circuit C (1, 2) connected to the electrode 804 of the pixel P (2, 1) different from the pixel P (1, 1). At this point, as shown in FIG. 10B, the area of the pixel P (1, 1) indicated by the dotted line preferably includes the entire area of the pixel circuit C (1, 1).

By arranging the pixel circuits in this manner, also in the present arrangement example, it is possible to obtain the same effect as that of Arrangement Example 1 described above.

Arrangement Example 3

FIG. 11A is a view showing another example in which the pixels are arranged in two rows and two columns.

In the pixel group of the present arrangement example shown in FIG. 11A, the pixel 860 shown in FIG. 3B is disposed as the pixel P (1, 1), and the electrodes 802 and 803 are disposed. Similarly, the pixel 860 shown in FIG. 3B is disposed as the pixel P (1, 2), and the electrodes 802A and 803A identical to the electrodes 802 and 803 are disposed. In addition, the pixel 870 shown in FIG. 4B is disposed as the pixel P (2, 1), and the electrodes 804, 805, and 806 are disposed. Similarly, the pixel 870 shown in FIG. 4B is disposed as the pixel P (2, 2), and the electrodes 804A, 805A, and 806A identical to the electrodes 804, 805, and 806 are disposed. In addition, as described above, the electrode 806 is disposed between the electrode 804 and the electrode 805, and the electrode 806A is disposed between the electrode 804A and the electrode 805A. FIG. 11A shows only the arrangement of two rows and two columns, but a plurality of the pixel groups each formed of the pixel P (1, 1) and the pixel P (2, 1) are repeatedly disposed in the pixel area 121 in FIG. 1.

Also in the present arrangement example, similarly to the example shown in FIG. 5A, the phase difference detection is performed based on the signals read from the electrodes 802 and 803 and the electrodes 802A and 803A, and the acquisition of the distance information is performed. In addition, similarly to the example shown in FIG. 10A, the phase difference detection is performed based on the signals read from the electrodes 804 and 805 and the electrodes 804A and 805A, and the acquisition of the distance information is performed.

FIG. 11B is a view showing the pixel circuits arranged in two rows and five columns correspondingly to the pixel group shown in FIG. 11A, and shows a plan view of the pixel group and the pixel circuit group.

Each of the number of pixel electrodes disposed in the pixels arranged in two rows and two columns shown in FIG. 11A and the number of pixel circuits shown in FIG. 11B is ten, and the pixel circuit group arranged in two rows and five columns is disposed below the electrode group of the pixel group arranged in two rows and two columns in the z direction. The pixel group arranged in two rows and two columns and the pixel circuit group arranged in two rows and five columns are disposed so as to overlap each other in the z direction.

Hereinbelow, a description will be given of a correspondence between the electrode and the pixel circuit. The pixel circuits are provided so as to correspond to the individual electrodes 802, 803, 804, 805, 806, 802A, 803A, 804A, 805A, and 806A.

For example, the electrode 802 is connected to the pixel circuit C (1, 1), the electrode 803 is connected to the pixel circuit C (1, 2), the electrode 804 is connected to the pixel circuit C (2, 1), the electrode 805 is connected to the pixel circuit C (2, 3), and the electrode 806 is connected to the pixel circuit C (2, 2). In addition, the electrode 802A is connected to the pixel circuit C (1, 3), the electrode 803A is connected to the pixel circuit C (1, 4), the electrode 804A is connected to the pixel circuit C (2, 4), the electrode 805A is connected to a pixel circuit C (1, 5), and the electrode 806A is connected to a pixel circuit C (2, 5).

In the present arrangement example, in the x direction, the pitch c of the pixel circuit is different from and smaller than the pitch a of the pixel, and corresponds to ⅖ of the pitch a of the pixel. In addition, in the x direction, the pitch c of the pixel circuit is larger than the pitch b between the electrode 804 and the electrode 806, or the pitch b between the electrode 805 and the electrode 806. In the y direction, the pitch of the pixel circuit is equal to the pitch of the pixel.

In addition, in the z direction, the pixel P (1, 1) is disposed so as to overlap the pixel circuits C (1, 1) and C (1, 2) connected to the electrodes 802 and 803, and overlap the pixel circuit C (1, 3) connected to the electrode 802A of the pixel P (1, 2) different from the pixel P (1, 1). At this point, as shown in FIG. 11B, the area of the pixel P (1, 1) indicated by the dotted line preferably includes the entire area of the pixel circuit C (1, 1).

By arranging the pixel circuits in this manner, also in the present arrangement example, it is possible to obtain the same effect as that of Arrangement Example 1 described above.

Arrangement Example 4

FIG. 12A is a view showing an example in which the pixels are arranged in three rows and two columns.

In the pixel group of the present arrangement example shown in FIG. 12A, in addition to the arrangement of the pixels shown in FIG. 10A in Arrangement Example 2, the pixel 860 shown in FIG. 3B is disposed as each of a pixel P (3, 1) and a pixel P (3, 2). That is, the electrode 802 and the electrode 803 are disposed so as to face each other in the pixel P (3, 1), and the electrode 802A and the electrode 803A identical to the electrode 802 and the electrode 803 are disposed so as to face each other in the pixel P (3, 2). FIG. 12A shows only the arrangement of three rows and two columns, but a plurality of the pixel groups each formed of the pixel P (1, 1), the pixel P (2, 1), and the pixel P (3, 1) are repeatedly disposed in the pixel area 121 in FIG. 1.

Also in the present arrangement example, similarly to the example shown in FIG. 11A, the phase difference detection is performed based on the signals read from the electrodes 802 and 803 and the electrodes 802A and 803A, and the acquisition of the distance information is performed. In addition, the phase difference detection is performed based on the signals read from the electrodes 804 and 805 and the electrodes 804A and 805A, and the acquisition of the distance information is performed.

FIG. 12B is a view showing the pixel circuits arranged in three rows and four columns correspondingly to the pixel group shown in FIG. 12A, and shows a plan view of the pixel group and the pixel circuit group.

Each of the number of pixel electrodes disposed in the pixels arranged in three rows and two columns shown in FIG. 12A and the number of pixel circuits shown in FIG. 12B is twelve, and the pixel circuit group arranged in three rows and four columns is disposed below the electrode group of the pixel group arranged in three rows and two columns in the z direction. In addition, the pixel group arranged in three rows and two columns and the pixel circuit group arranged in three rows and four columns are disposed so as to overlap each other in the z direction.

Hereinbelow, a description will be given of a correspondence between the electrode and the pixel circuit. The pixel circuits are provided so as to correspond to the individual electrodes 801, 802, 803, 804, 805, 806, 801A, 802A, 803A, 804A, 805A, and 806A.

For example, the electrode 801 is connected to the pixel circuit C (1, 1), the electrode 802 is connected to a pixel circuit C (3, 1), and the electrode 803 is connected to a pixel circuit C (3, 2). In addition, the electrode 804 is connected to the pixel circuit C (2, 1), the electrode 805 is connected to the pixel circuit C (2, 2), and the electrode 806 is connected to the pixel circuit C (1, 2). Further, the electrode 801A is connected to the pixel circuit C (1, 3), the electrode 802A is connected to a pixel circuit C (3, 3), and the electrode 803A is connected to a pixel circuit C (3, 4). In addition, the electrode 804A is connected to the pixel circuit C (2, 3), the electrode 805A is connected to the pixel circuit C (2, 4), and the electrode 806A is connected to the pixel circuit C (1, 4).

In the present arrangement example, in the x direction, the pitch c of the pixel circuit is different from and smaller than the pitch a of the pixel, and corresponds to ½ of the pitch a of the pixel. In addition, in the x direction, the pitch c of the pixel circuit is larger than the pitch b between the electrode 804 and the electrode 806, or the pitch b between the electrode 805 and the electrode 806. In the y direction, the pitch of the pixel circuit is equal to the pitch of the pixel.

Further, in the z direction, the pixel P (1, 1) is disposed so as to overlap the pixel circuit C (1, 1) connected to the electrode 801, and overlap the pixel circuit C (1, 2) connected to the electrode 806 of the pixel P (2, 1) different from the pixel P (1, 1). At this point, as shown in FIG. 12B, the area of the pixel P (1, 1) indicated by the dotted line preferably includes the entire area of the pixel circuit C (1, 1).

By arranging the pixel circuits in this manner, also in the present arrangement example, it is possible to obtain the same effect as that of Arrangement Example 1 described above.

Arrangement Example 5

Figure 13B:
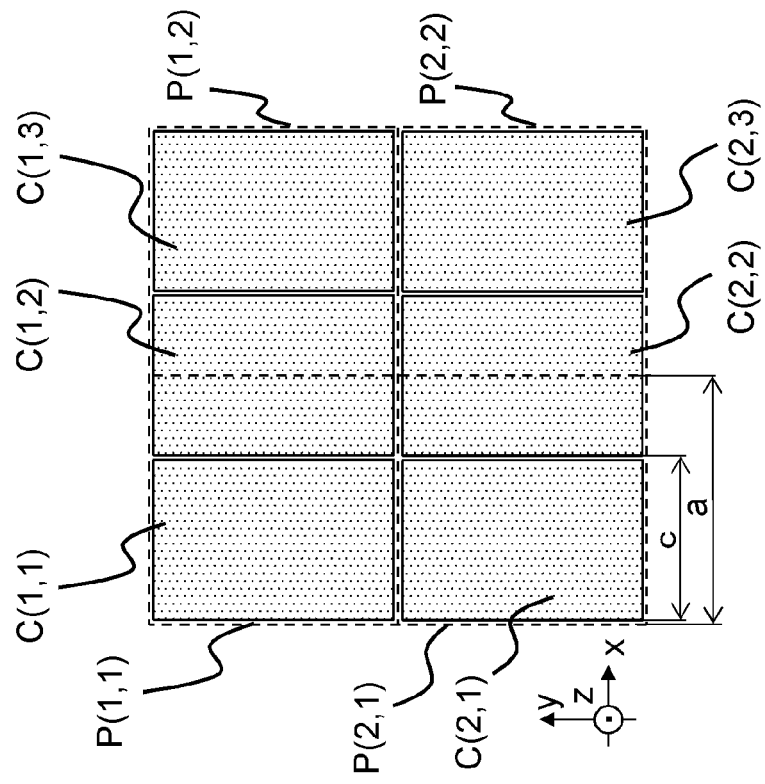
FIGS. 13A and 13B are views each schematically showing Arrangement Example 5 of the pixel according to the embodiment.
Figure 13A:
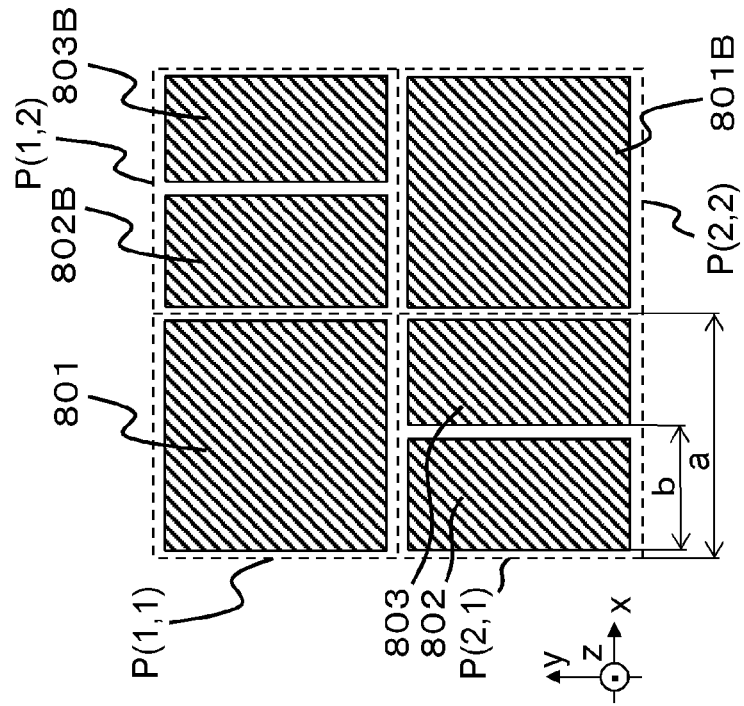

FIG. 13A is a view showing a modification of the arrangement of the pixels shown in FIG. 5A.

The pixel group of the present arrangement example shown in FIG. 13A is different from the pixel group shown in FIG. 5A in that the disposition of the electrode in the pixel P (1, 2) and the disposition of the electrode in the pixel P (2, 2) change places. That is, the pixel 860 shown in FIG. 3B is disposed as the pixel P (1, 2), and an electrode 802B and an electrode 803B identical to the electrode 802 and the electrode 803 are disposed. The pixel 800 shown in FIG. 2B is disposed as the pixel P (2, 2), and an electrode 801B identical to the electrode 801 is disposed. FIG. 13A shows only the arrangement of two rows and two columns, but a plurality of the pixel groups each having the pixels arranged in two rows and two columns are repeatedly disposed in the pixel area 121 in FIG. 1.

FIG. 13B is a view showing the pixel circuits arranged in two rows and three columns correspondingly to the pixel group shown in FIG. 13A, and shows a plan view of the pixel group and the pixel circuit group.

Each of the number of pixel electrodes disposed in the pixels arranged in two rows and two columns shown in FIG. 13A and the number of pixel circuits shown in FIG. 13B is six, and the pixel circuit group arranged in two rows and three columns is disposed below the electrode group of the pixel group arranged in two rows and two columns in the z direction. In addition, the pixel group arranged in two rows and two columns and the pixel circuit group arranged in two rows and three columns are disposed so as to overlap each other in the z direction.

Hereinbelow, a description will be given of a correspondence between the electrode and the pixel circuit.

For example, the electrode 801 is connected to the pixel circuit C (1, 1), the electrode 802 is connected to the pixel circuit C (2, 1), and the electrode 803 is connected to the pixel circuit C (2, 2). In addition, the electrode 801B is connected to the pixel circuit C (2, 3), the electrode 802B is connected to the pixel circuit C (1, 2), and the electrode 803B is connected to the pixel circuit C (1, 3).

In the present arrangement example, similarly to the example in FIGS. 5A and 5B, in the x direction, the pitch c of the pixel circuit is different from and smaller than the pitch a of the pixel, and corresponds to ⅔ of the pitch a of the pixel. In addition, the pitch c of the pixel circuit is larger than the pitch b between the electrode 802 and the electrode 803. In the y direction, the pitch of the pixel circuit is equal to the pitch of the pixel.

In addition, in the z direction, the pixel P (1, 1) is disposed so as to overlap the pixel circuit C (1, 1) connected to the electrode 801, and overlap the pixel circuit C (1, 2) connected to the electrode 802B of the pixel P (1, 2) different from the pixel P (1, 1). At this point, as shown in FIG. 13B, the area of the pixel P (1, 1) indicated by the dotted line preferably includes the entire area of the pixel circuit C (1, 1).

By arranging the pixel circuits in this manner, also in the present arrangement example, it is possible to obtain the same effect as that of Arrangement Example 1 described above.

Arrangement Example 6

Figure 14B:
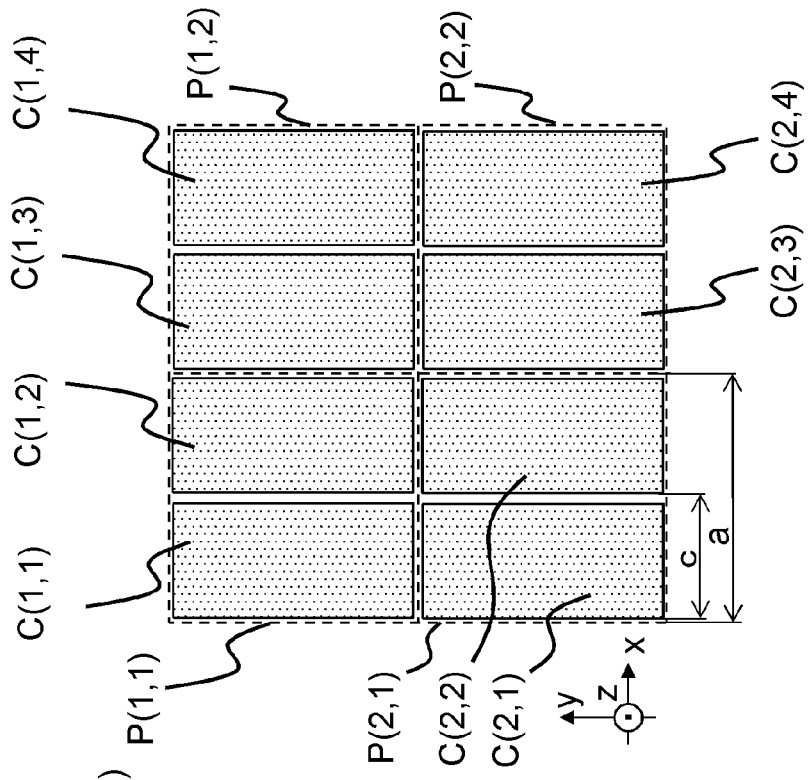
FIGS. 14A and 14B are views each schematically showing Arrangement Example 6 of the pixel according to the embodiment.
Figure 14A:
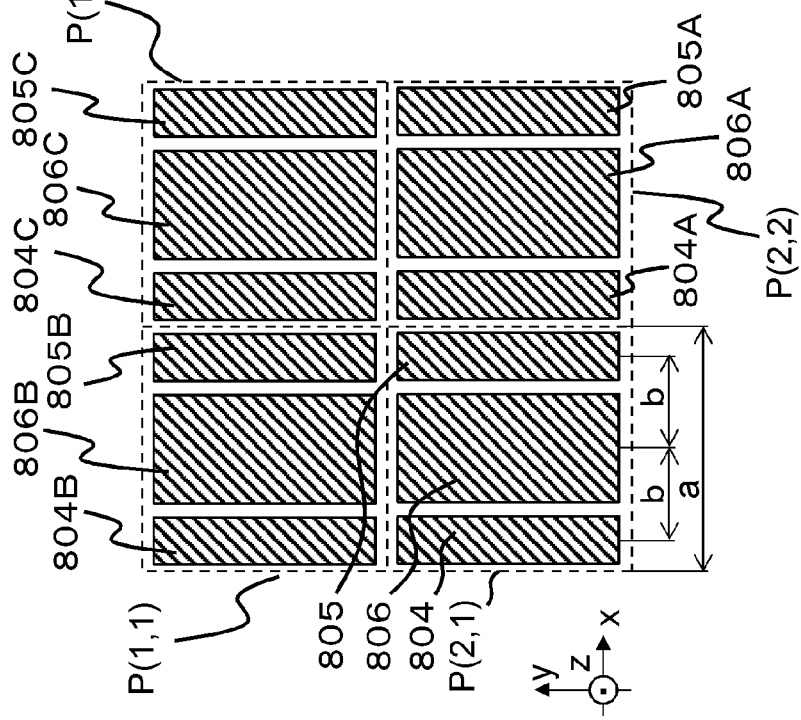

FIG. 14A is a view showing a modification of the arrangement of the pixels shown in FIG. 10A.

The pixel group of the present arrangement example shown in FIG. 14A is different from the pixel group shown in FIG. 10A in the disposition of the electrode in each of the pixel P (1, 1) and the pixel P (1, 2). That is, each of the pixels arranged in two rows and two columns of the present arrangement example shown in FIG. 14A is the pixel 870 shown in FIG. 4B, and electrodes 804B, 805B, and 806B identical to the electrodes 804, 805, and 806 are disposed in the pixel P (1, 1). In addition, electrodes 804C, 805C, and 806C identical to the electrodes 804, 805, and 806 are disposed in the pixel P (1, 2). Note that the electrodes 804B, 805B, and 806B are short-circuited in wiring in lower layers, and the electrodes 804C, 805C, and 806C are similarly short-circuited in wiring in lower layers. That is, the electrodes 804B, 805B, and 806B are configured so as not to be controlled independently of each other, and the electrodes 804C, 805C, and 806C are configured so as not to be controlled independently of each other. At this point, one pixel circuit is provided to correspond to three electrodes 804B, 805B, and 806B, and one pixel circuit is provided to correspond to three electrodes 804C, 805C, and 806C.

Figure 15:
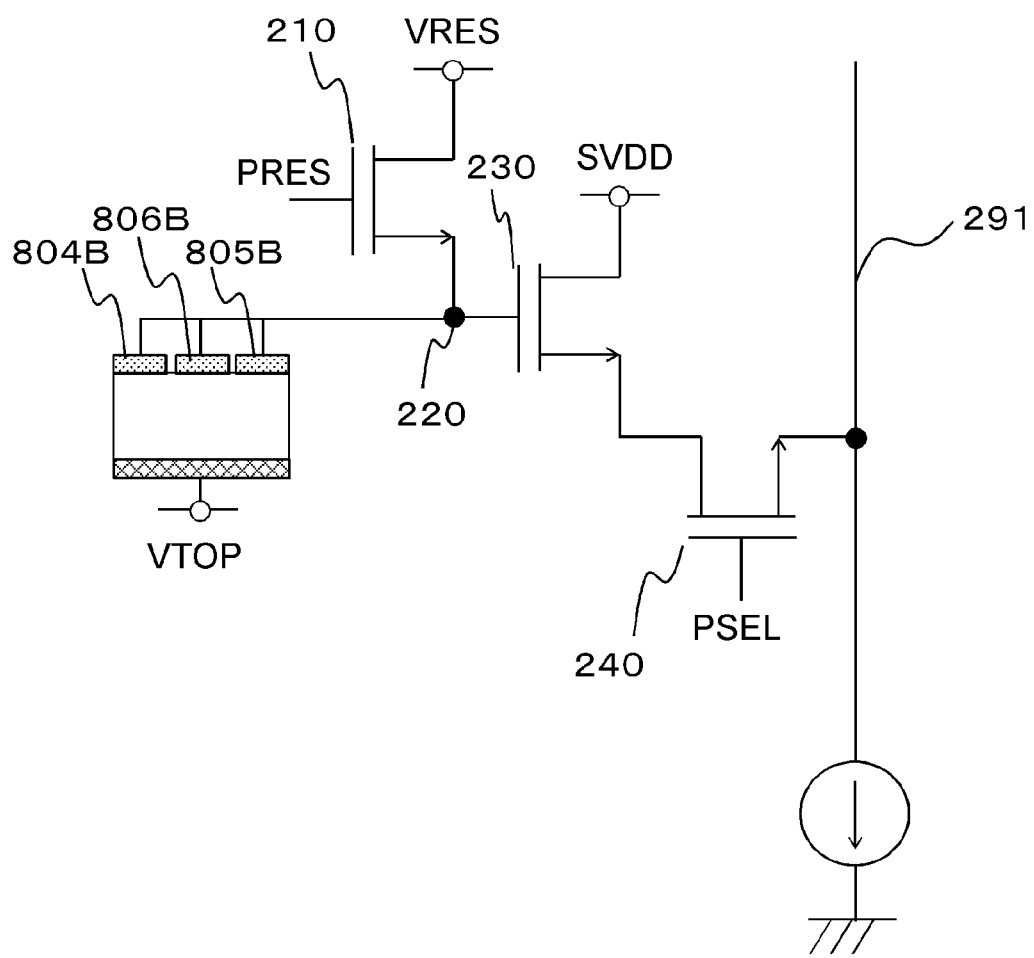
FIG. 15 is an equivalent circuit diagram of the pixel circuit of Arrangement Example 6 of the pixel according to the embodiment.

FIG. 15 shows an equivalent circuit diagram of the pixel circuit connected to the electrodes 804B, 805B, and 806B. As shown in FIG. 15, one pixel circuit is provided to correspond to three electrodes 804B, 805B, and 806B.

FIG. 14B is a view showing the pixel circuits arranged in two rows and four columns correspondingly to the pixel group shown in FIG. 14A, and shows a plan view of the pixel group and the pixel circuit group.

The number of pixel electrodes disposed in the pixels arranged in two rows and two columns shown in FIG. 14A is twelve, and the number of pixel electrodes that can be controlled independently of each other is substantially eight. The number of pixel electrodes is equal to the number of pixel circuits shown in FIG. 14B, and the pixel circuit group arranged in two rows and four columns is disposed below the electrode group of the pixel group arranged in two rows and two columns in the z direction. The pixel group arranged in two rows and two columns and the pixel circuit group arranged in two rows and four columns are disposed to as to overlap each other in the z direction.

Hereinbelow, a description will be given of a correspondence between the electrode and the pixel circuit.

For example, the electrode 804B, the electrode 805B, and the electrode 806B are connected to the pixel circuit C (1, 1), the electrode 804 is connected to the pixel circuit C (2, 1), the electrode 805 is connected to the pixel circuit C (2, 2), and the electrode 806 is connected to the pixel circuit C (1, 2). In addition, the electrode 804C, the electrode 805C, and the electrode 806C are connected to the pixel circuit C (1, 3), the electrode 804A is connected to the pixel circuit C (2, 3), the electrode 805A is connected to the pixel circuit C (2, 4), and the electrode 806A is connected to the pixel circuit C (1, 4).

In the present arrangement example, in the x direction, the pitch c of the pixel circuit is different from and smaller than the pitch a of the pixel, and corresponds to ½ of the pitch a of the pixel. In addition, the pitch c of the pixel circuit is larger than the pitch b between the electrode 804 and the electrode 806, or the pitch b between the electrode 805 and the electrode 806. In the y direction, the pitch of the pixel circuit is equal to the pitch of the pixel.

In addition, in the z direction, the pixel P (1, 1) is disposed so as to overlap the pixel circuit C (1, 1) connected to the electrodes 804B, 805B, and 806B, and overlap the pixel circuit C (1, 2) connected to the electrode 806 of the pixel P (2, 1) different from the pixel P (1, 1). At this point, as shown in FIG. 14B, the area of the pixel P (1, 1) indicated by the dotted line preferably includes the entire area of the pixel circuit C (1, 1).

By arranging the pixel circuits in this manner, also in the present arrangement example, it is possible to obtain the same effect as that of Arrangement Example 1 described above.

Next, definition of the pitch of the pixel circuit will be described by using FIG. 16 and FIG. 17.

Figure 16:
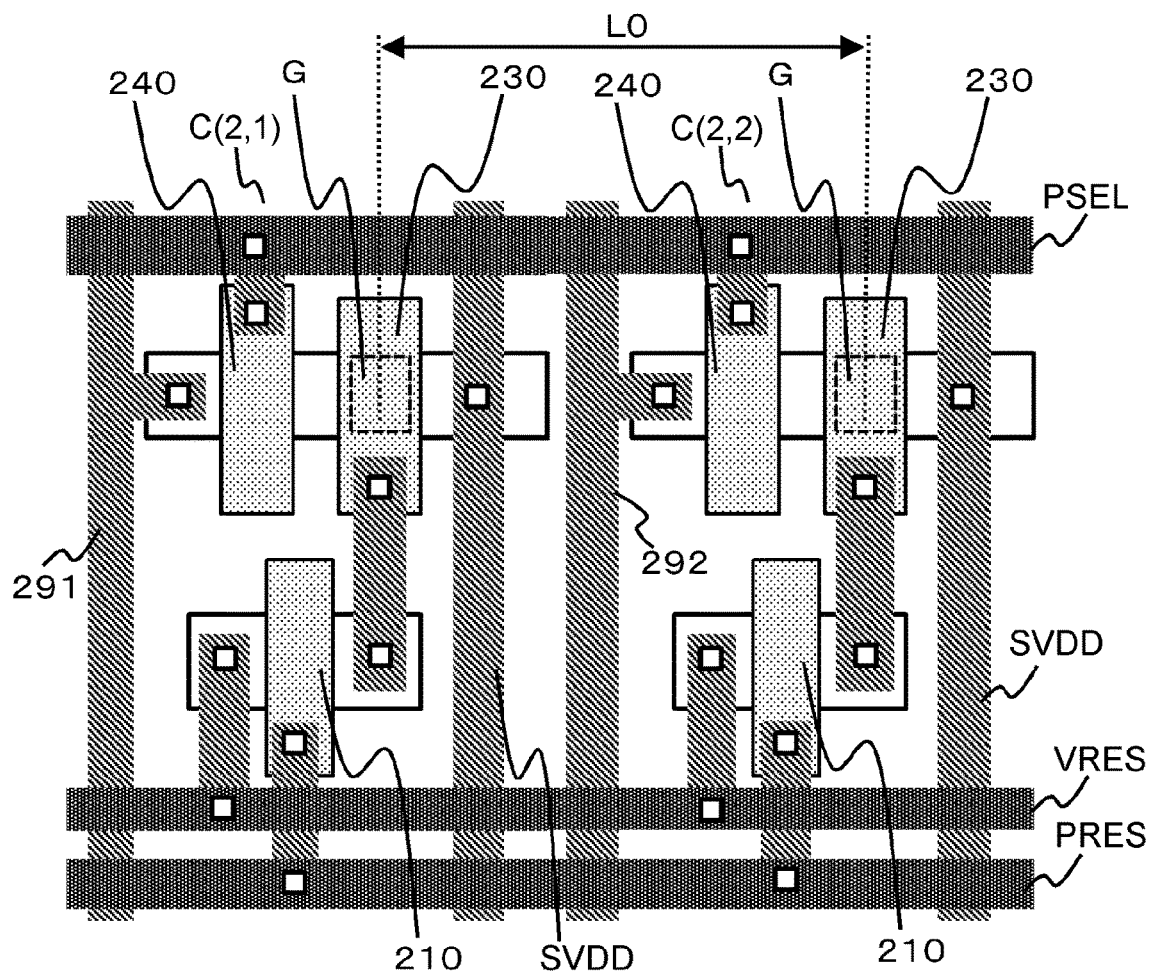
FIG. 16 is a view for explaining a pitch of the pixel circuit of the embodiment.

FIG. 16 is a view for explaining the pitch of the pixel circuit, and shows, as an example, the layout of the pixel circuit corresponding to the equivalent circuit diagram in FIG. 6B.

As shown in FIG. 16, in the pixel circuit, the amplification transistor 230, the reset transistor 210, and the selection transistor 240 are disposed. The pitch of the pixel circuit can be defined based on, e.g., a distance L0 between the centers of gates G of the amplification transistors 230 of two adjacent pixel circuits.

Figure 17:
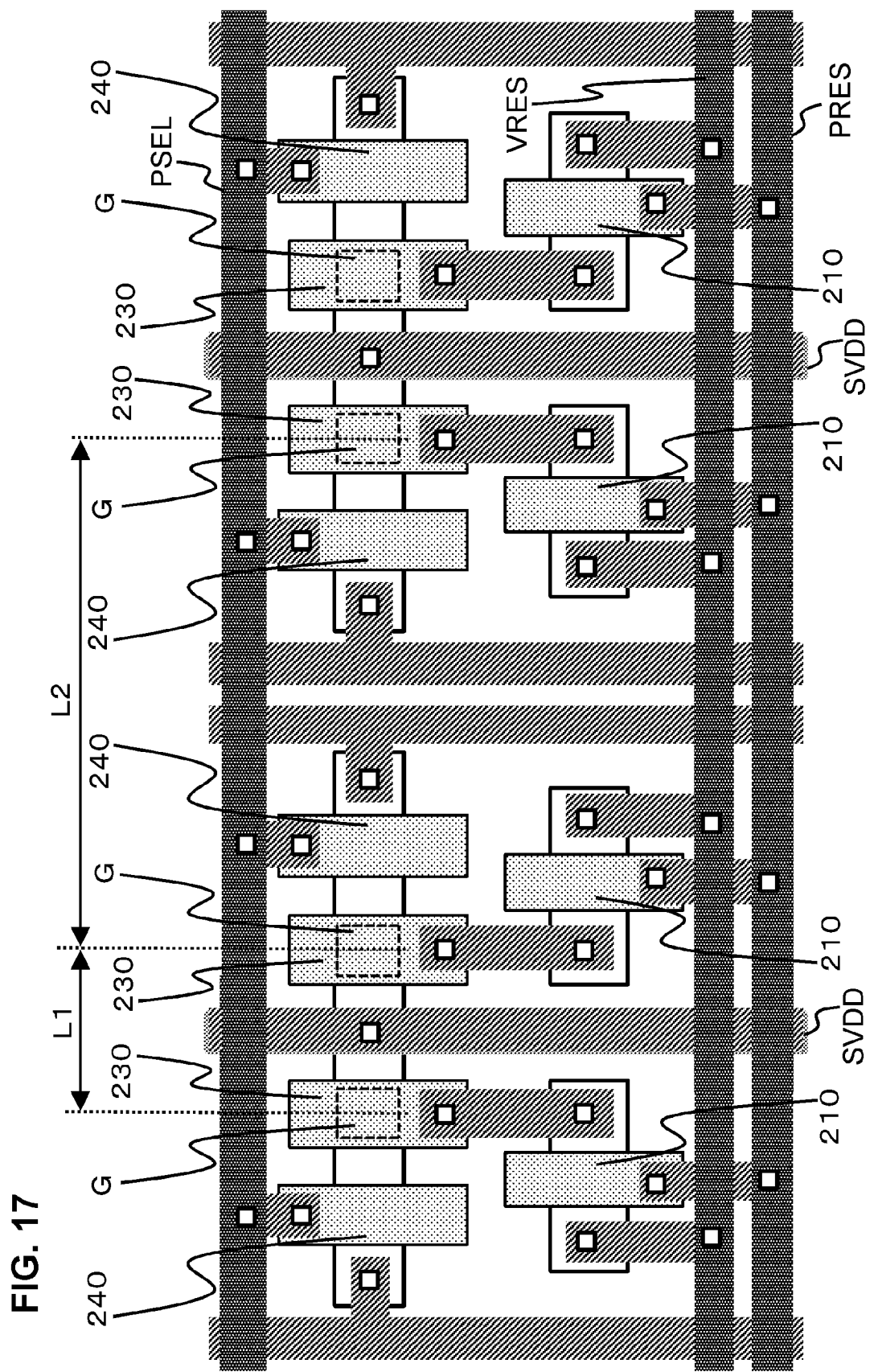
FIG. 17 is a view for explaining the pitch of the pixel circuit of the embodiment.

FIG. 17 is a view for explaining the pitch of the pixel circuit, and is a view for explaining the layout in which the pixel circuit is flipped in the x direction and disposed, and the reference power supply SVDD is shared by adjacent pixel circuits.

In this case, the distance between the centers of the gates G of the amplification transistors 230 of the adjacent pixel circuits has two values that are a distance L1 and a distance L2. In such a case, the pitch of the pixel circuit is defined based on the average value of the distance L1 and the distance L2.

That is, in the case where the pixel circuit is flipped, the pitch of the pixel circuit can be defined as the average value of the distances between the centers of the gates G of the amplification transistors 230 of the adjacent pixel circuits also in the case where the pixel circuit is not flipped.

From two-dimensional arrangement examples of a plurality of pixels described in Arrangement Examples 1 to 6, it can be seen that the following relationship is established between the pixel group formed of a plurality of adjacent pixels and the pixel circuit group corresponding to the pixel group. This is the relationship among the pitch of the pixel circuit of the pixel circuit group in the x direction, the pitch of the pixel of the pixel group in the x direction, the number of pixels in the pixel group, and the number of electrodes that are disposed in the pixel group and can be controlled independently of each other, and the relationship is given by the following expression.

(pitch of pixel circuit)=(pitch of pixel)×(number of pixels)/(number of electrodes that can be controlled independently of each other)

By arranging the electrodes and the pixel circuits such that this relationship is established, it is possible to obtain the same effect as that of Arrangement Example 1 described above.

<With Regard to Photoelectric Conversion System>

Figure 18:
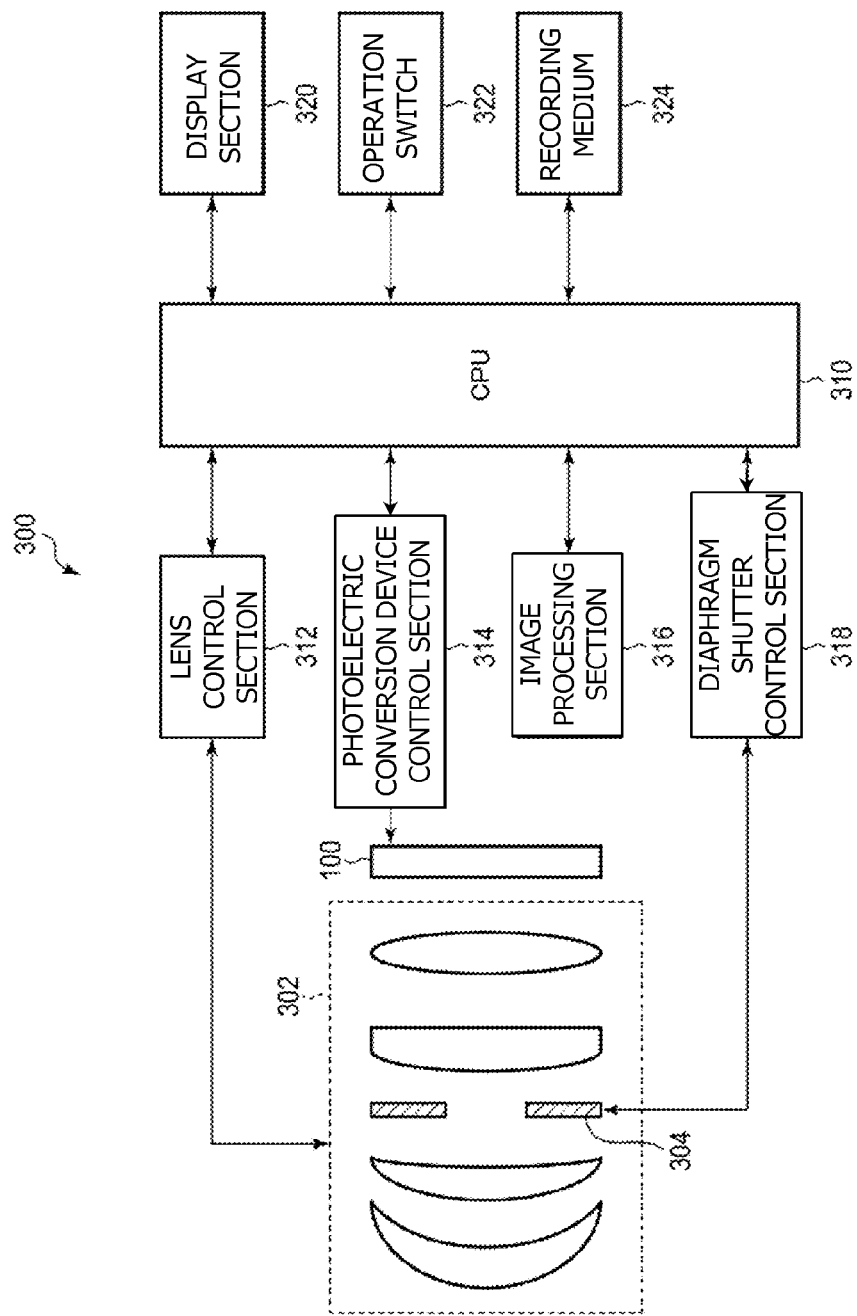
FIG. 18 is a view showing the configuration of a photoelectric conversion system of the embodiment.

A photoelectric conversion system according to the present embodiment will be described by using FIG. 18. FIG. 18 is a block diagram showing the schematic configuration of the photoelectric conversion system according to the present embodiment.

The above-described photoelectric conversion device 100 can be applied to various photoelectric conversion systems. The photoelectric conversion system to which the photoelectric conversion device 100 can be applied is not particularly limited, and examples of the photoelectric conversion system include a digital still camera, a digital camcorder, a surveillance camera, a copier, a fax machine, a cellular phone, a vehicle-mounted camera, and an observation satellite. In addition, the photoelectric conversion system also includes a camera module that includes an optical system such as a lens and a photoelectric conversion device. FIG. 18 shows a block diagram of a digital still camera as an example of the photoelectric conversion system.

As shown in FIG. 18, a photoelectric conversion system 300 includes a photoelectric conversion optical system 302, a CPU 310, a lens control section 312, a photoelectric conversion device control section 314, an image processing section 316, a diaphragm shutter control section 318, a display section 320, an operation switch 322, and a recording medium 324.

The photoelectric conversion optical system 302 is the optical system for forming an optical image of a subject, and includes a lens group and a diaphragm 304. The diaphragm 304 has the function of adjusting the amount of light in photographing by adjusting the diameter of its opening, and also has the function as a shutter for exposure time adjustment in photographing of a still image. The lens group and the diaphragm 304 are held so as to be capable of moving forward and backward along an optical axis direction, and a scaling function (zoom function) and a focusing function are implemented using operations in which the lens group and the diaphragm 304 are interlocked with each other. The photoelectric conversion optical system 302 may be integrated with the photoelectric conversion system, or may be a photoelectric conversion lens that can be mounted to the photoelectric conversion system.

The photoelectric conversion device 100 is disposed such that a photoelectric conversion plane is positioned in the image space of the photoelectric conversion optical system 302. The photoelectric conversion device 100 is the photoelectric conversion device 100 described above, and includes a CMOS sensor (pixel area 121) and its peripheral circuit (peripheral circuit area). In the photoelectric conversion device 100, a plurality of pixels having photoelectric conversion sections are two-dimensionally arranged, color filters are disposed in the pixels, and a two-dimensional single-plate color sensor is thereby configured. The photoelectric conversion device 100 photoelectrically converts a subject image formed by the photoelectric conversion optical system 302, and outputs the subject image as an image signal or a focus detection signal.

The lens control section 312 is used for controlling the forward/backward movement of the lens group of the photoelectric conversion optical system 302 to perform a scaling operation and focusing, and is constituted by circuits and processing devices configured to implement the function. The diaphragm shutter control section 318 is used for adjusting the amount of light in photographing by changing the diameter of the opening of the diaphragm 304 (by varying an F-number), and is constituted by circuits and processing devices configured to implement the function.

The CPU 310 is a control device in the camera that is responsible for various control operations of a camera main body, and includes a mathematical operation section, a ROM, a RAM, an A/D converter, a D/A converter, and a communication interface circuit. The CPU 310 controls the operations of the individual sections in the camera according to a computer program stored in the ROM or the like, and executes a series of photographing operations such as AF including detection of a focus state (focus detection) of the photoelectric conversion optical system 302, photoelectric conversion, image processing, and recording. The CPU 310 is also a signal processing section.

The photoelectric conversion device control section 314 is used for controlling the operation of the photoelectric conversion device 100, and performing A/D conversion on a signal output from the photoelectric conversion device 100 and transmitting the signal to the CPU 310, and is constituted by circuits and control devices configured to implement the functions. The photoelectric conversion device 100 may have the A/D conversion function. The image processing section 316 is used for generating an image signal by performing image processing such as y conversion or color interpolation on the signal subjected to the A/D conversion, and is constituted by circuits and control devices configured to implement the function. The display section 320 is a display device such as a liquid crystal display device (LCD), and displays information related to a photographing mode of the camera, a preview image before photographing, an image for checking after photographing, and an in-focus state in focus detection. The operation switch 322 is constituted by a power switch, a release (photographing trigger) switch, a zoom operation switch, and a photographing mode selection switch. The recording medium 324 is used for recording a photographed image or the like. The recording medium 324 may be incorporated in the photoelectric conversion system, or may also be a detachable recording medium such as a memory card.

By constituting the photoelectric conversion system 300 to which the above-described photoelectric conversion device 100 is applied in this manner, it is possible to implement the photoelectric conversion system having high performance capable of focusing with high accuracy and acquiring an image having a large depth of field.

Other Embodiments

Figure 19A:
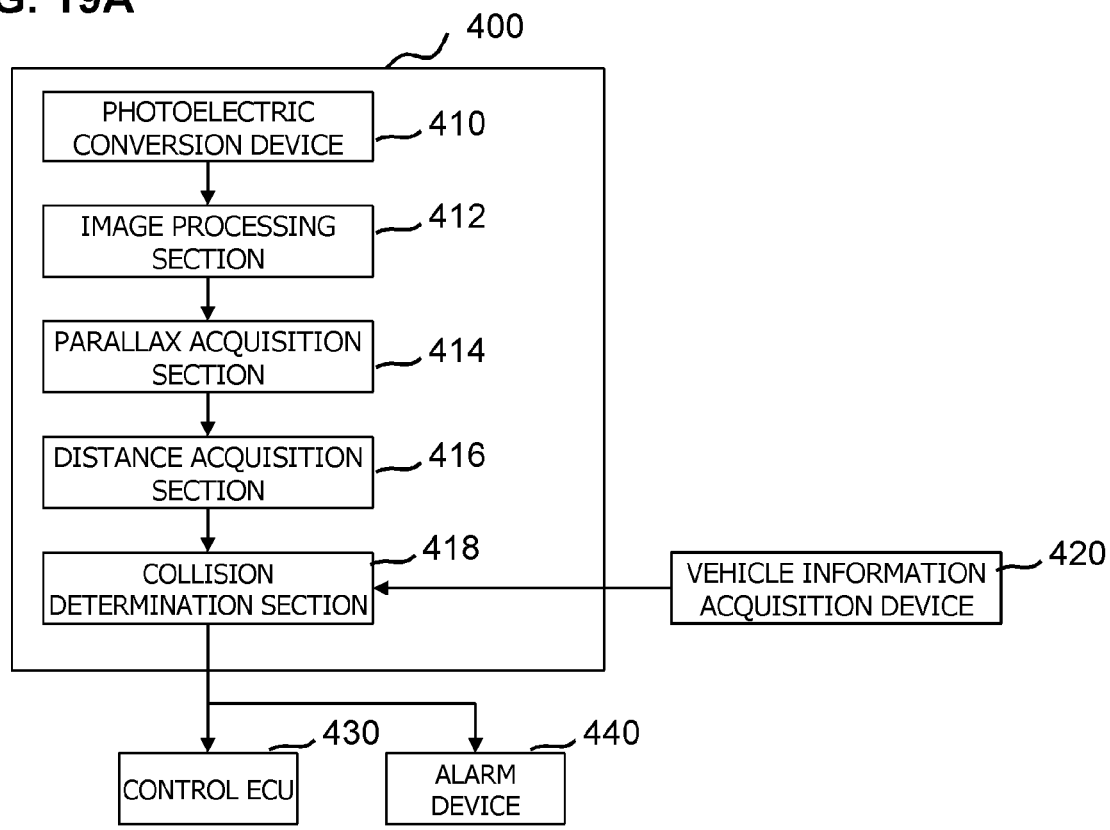
FIGS. 19A and 19B are views showing the configurations of a photoelectric conversion system and a movable body of another embodiment.
Figure 19B:
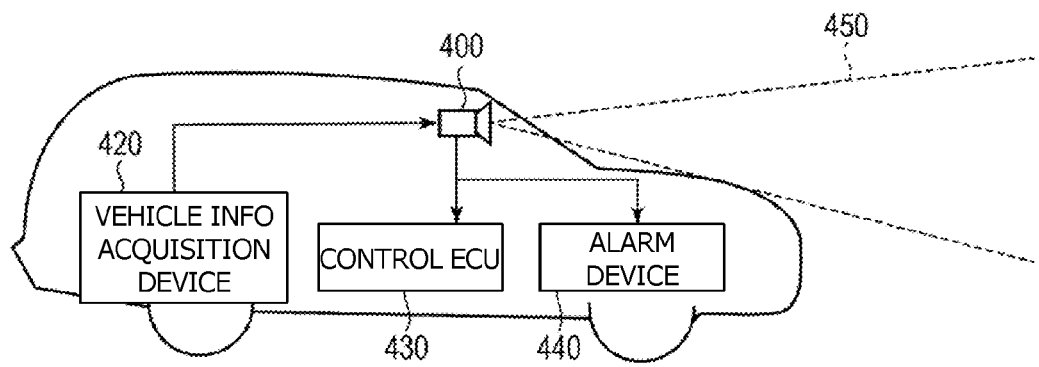

A description will be given of a photoelectric conversion system and a movable body according to another embodiment by using FIGS. 19A and 19B. FIGS. 19A and 19B are views showing the configurations of the photoelectric conversion system and the movable body according to another embodiment.

FIG. 19A shows an example of a photoelectric conversion system 400 related to a vehicle-mounted camera. The photoelectric conversion system 400 includes a photoelectric conversion device 410. The photoelectric conversion device 410 is the above-described photoelectric conversion device 100. The photoelectric conversion system 400 includes an image processing section 412 that performs image processing on a plurality of pieces of image data acquired by the photoelectric conversion device 410, and a parallax acquisition section 414 that calculates a parallax (e.g., a phase difference of a parallax image) from the plurality of pieces of image data acquired by the photoelectric conversion device 410. In addition, the photoelectric conversion system 400 includes a distance acquisition section 416 that calculates a distance to an object based on the calculated parallax, and a collision determination section 418 that determines whether or not a collision may occur based on the calculated distance. The parallax acquisition section 414 or the distance acquisition section 416 is an example of a distance information acquisition unit that acquires information on the distance to the object (distance information). That is, the distance information is pieces of information related to the parallax, a defocus amount, and the distance to the object. The collision determination section 418 may determine the probability of the collision by using any of the pieces of information serving as the distance information. The distance information acquisition unit may be implemented by hardware designed exclusively for the distance information acquisition unit, or may also be implemented by a software module. In addition, the distance information acquisition unit may be implemented by a field programmable gate array (FPGA), an application specific integrated circuit (ASIC), or a combination thereof.

The photoelectric conversion system 400 is connected to a vehicle information acquisition device 420, and can acquire vehicle information such as a vehicle speed, a yaw rate, and a rudder angle. In addition, a control ECU 430 serving as a control device that outputs a control signal for generating a braking force applied to the vehicle based on the determination result of the collision determination section 418 is connected to the photoelectric conversion system 400. That is, the control ECU 430 is an example of a movable body control unit that controls the movable body based on the distance information. In addition, the photoelectric conversion system 400 is also connected to an alarm device 440 that issues an alarm to a driver based on the determination result of the collision determination section 418. For example, in the case where the probability of the collision is high based on the determination result of the collision determination section 418, the control ECU 430 performs vehicle control that avoids the collision or reduces damage by braking, releasing an accelerator, or reducing an engine output. The alarm device 440 warns the driver by sounding an alarm, displaying alarm information on a screen of a car navigation system or the like, or vibrating a seatbelt or a steering.

In the present embodiment, the surroundings of the vehicle, e.g., the front or the rear of the vehicle is imaged by the photoelectric conversion system 400. FIG. 19B shows the photoelectric conversion system 400 in the case where the front of the vehicle (photoelectric conversion area 450) is imaged. The vehicle information acquisition device 420 sends a command such that the photoelectric conversion system 400 is caused to operate and execute photoelectric conversion. By using the above-described photoelectric conversion device 100 as the photoelectric conversion device 410, the photoelectric conversion system 400 of the present embodiment can further improve accuracy in distance measurement.

In the above description, while the example in which the control is performed such that the vehicle does not collide with another vehicle has been described, the photoelectric conversion system can also be applied to a control in which an autonomous vehicle travels so as to follow another vehicle, or a control in which the autonomous vehicle travels so as not to run over the lane. Further, the photoelectric conversion system can also be applied not only to the vehicle such as an automobile but also a movable body (movable device) such as, e.g., a ship, an aircraft, or an industrial robot. In addition, the application of the photoelectric conversion system is not limited to the movable body, and the photoelectric conversion system can be applied to equipment that uses object recognition widely such as intelligent transportation systems (ITS).

The above embodiments and arrangement examples are only those showing examples of embodiment in practicing the present invention, and shall not be those by which the technical scope of the present invention is construed as being restrictive. That is, the present invention may be practiced in various forms without deviation from its technical idea or its main features. In addition, the individual embodiments and the individual arrangement examples described above may be combined or modified whenever possible within the scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-12589, filed on Jan. 29, 2018, which is hereby incorporated by reference herein in its entirety.

What is claimed is:

1. A photoelectric conversion device in which a plurality of pixels are arranged in a matrix,
wherein each of the pixels includes:
at least one pixel electrode,
a photoelectric conversion layer that is provided on the pixel electrode,
a counter electrode that is provided on the photoelectric conversion layer, and
a pixel circuit that is connected to the pixel electrode and outputs a signal from the pixel electrode,
wherein a pixel circuit group corresponding to a pixel group formed of the plurality of pixels positioned adjacent to each other is disposed below a pixel electrode group of the pixel group,
wherein the pixel group includes a first pixel, and a second pixel having more independent pixel electrodes than the first pixel, the independent pixel electrodes being pixel electrodes controllable independently,
wherein each of a plurality of the pixel circuits is connected to each of a plurality of the independent pixel electrodes, and
wherein in a plan view, the first pixel overlaps with a pixel circuit, among the plurality of pixel circuits, that is electrically connected to the first pixel, and overlaps with a pixel circuit, among the plurality of pixel circuits, that is not electrically connected to the first pixel.

2. The photoelectric conversion device according to claim 1, wherein in the plan view, the independent pixel electrode of the first pixel overlaps with the pixel circuit that is electrically connected to the first pixel, and overlaps with the pixel circuit that is not electrically connected to the first pixel.

3. The photoelectric conversion device according to claim 1, wherein in the plan view, the independent pixel electrode of the first pixel overlaps with an amplification transistor of the pixel circuit that corresponds to the first pixel, and overlaps with an amplification transistor of the pixel circuit that does not correspond to the first pixel.

4. The photoelectric conversion device according to claim 1, wherein the pixel circuit that is not electrically connected to the first pixel is the pixel circuit that is electrically connected to the second pixel.

5. The photoelectric conversion device according to claim 1, wherein an area in which the first pixel is positioned includes an entire area in which the pixel circuit that is electrically connected to the first pixel is positioned in the plan view.

6. The photoelectric conversion device according to claim 1, wherein a plurality of microlenses are disposed so as to correspond to the plurality of pixels, respectively.

7. The photoelectric conversion device according to claim 1, wherein a signal for photoelectric conversion is read from the independent pixel electrode of the first pixel.

8. The photoelectric conversion device according to claim 1,
wherein the second pixel includes a first independent pixel electrode and a second independent pixel electrode that are arranged side by side in order to detect a phase difference, and
wherein a signal for phase difference detection is read from each of the first independent pixel electrode and the second independent pixel electrode.

9. The photoelectric conversion device according to claim 8, wherein the second pixel includes a third independent pixel electrode which is disposed between the first independent pixel electrode and the second independent pixel electrode and from which a signal for photoelectric conversion is read.

10. The photoelectric conversion device according to claim 9,
wherein a signal from the pixel circuit in a selected row, among a plurality of the pixel circuits arranged in a matrix, is output on a per column basis, and
wherein a column in which the pixel circuit connected to the third independent pixel electrode is disposed is different from a column in which the pixel circuit connected to the first independent pixel electrode is disposed and a column in which the pixel circuit connected to the second independent pixel electrode is disposed.

11. The photoelectric conversion device according to claim 8,
wherein a signal from the pixel circuit in a selected row, among a plurality of the pixel circuits arranged in a matrix, is output on a per column basis, and
wherein the pixel circuit connected to the first independent pixel electrode and the pixel circuit connected to the second independent pixel electrode are disposed in the same row.

12. The photoelectric conversion device according to claim 1, wherein the plurality of pixels include a pixel having a plurality of the pixel electrodes that are short-circuited and connected to each other, and are connected to one pixel circuit.

13. A photoelectric conversion system comprising:
the photoelectric conversion device according to claim 1; and
a signal processing section configured to process a signal output from the photoelectric conversion device.

14. A movable body comprising:
the photoelectric conversion device according to claim 1;
a distance information acquisition unit configured to acquire, from a signal output from the pixel of the photoelectric conversion device, distance information that is information on a distance to an object; and
a control unit configured to control the movable body based on the distance information.

15. A photoelectric conversion device in which a plurality of pixels are arranged in a matrix,
wherein each of the pixels includes:
at least one pixel electrode,
a photoelectric conversion layer that is provided on the pixel electrode,
a counter electrode that is provided on the photoelectric conversion layer, and
a pixel circuit that is connected to the pixel electrode and outputs a signal from the pixel electrode,
wherein a pixel circuit group corresponding to a pixel group formed of the plurality of pixels positioned adjacent to each other is disposed below a pixel electrode group of the pixel group,
wherein the pixel group includes a first pixel, and a second pixel having more independent pixel electrodes than the first pixel, the independent pixel electrodes being pixel electrodes controllable independently,
wherein each of a plurality of the pixel circuits is connected to each of a plurality of the independent pixel electrodes, and wherein a pitch of the pixel circuit of the pixel circuit group is larger than a pitch of the independent pixel electrode of the second pixel, and the pitch of the pixel circuit of the pixel circuit group is smaller than a pitch of the pixel of the pixel group in an arrangement direction in which the independent pixel electrodes of the second pixel are arranged.

16. The photoelectric conversion device according to claim 15, wherein the pitch of the pixel circuit of the pixel circuit group in the arrangement direction, the pitch of the pixel of the pixel group in the arrangement direction, the number of the pixels of the pixel group, and the number of the independent pixel electrodes of the pixel group establish a relationship given by (the pitch of the pixel circuit)=(the pitch of the pixel)×(the number of the pixels)/(the number of the independent pixel electrodes).

17. The photoelectric conversion device according to claim 15,
wherein each pixel circuit includes an amplification transistor, and
wherein the pitch of the pixel circuit of the pixel circuit group is an average value of a distance between centers of gates of the amplification transistors of the two pixel circuits positioned adjacent to each other.

* * * * *